(12) United States Patent
Sato et al.

(10) Patent No.: US 7,371,654 B2
(45) Date of Patent: May 13, 2008

(54) MANUFACTURING METHOD OF SEMICONDUCTOR DEVICE WITH FILLING INSULATING FILM INTO TRENCH

(75) Inventors: Atsuhiro Sato, Kanagawa-ken (JP); Masayuki Ichige, Kanagawa-ken (JP); Seiichi Mori, Tokyo (JP); Yuji Takeuchi, Kanagawa (JP); Hiroaki Hazama, Tokyo (JP); Yukio Nishiyama, Kanagawa (JP); Hirotaka Ogihara, Saitama-ken (JP); Naruhiko Kaji, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 11/395,134

(22) Filed: Apr. 3, 2006

(65) Prior Publication Data

US 2006/0189092 A1  Aug. 24, 2006

Related U.S. Application Data

(62) Division of application No. 10/799,881, filed on Mar. 15, 2004, now abandoned, which is a division of application No. 10/140,941, filed on May 9, 2002, now Pat. No. 6,798,038.

(30) Foreign Application Priority Data

Sep. 20, 2001  (JP)  ............................ 2001-286754

(51) Int. Cl.
 *H01L 21/76* (2006.01)
(52) U.S. Cl. ............................... 438/424; 257/E21.546
(58) Field of Classification Search ........ 438/424–444; 257/E21.54, E21.545, E21.546, E21.548
See application file for complete search history.

(56) References Cited

U.S. PATENT DOCUMENTS

| 5,135,879 | A | 8/1992 | Richardson |
|---|---|---|---|
| 6,057,580 | A | 5/2000 | Watanabe et al. |
| 6,096,622 | A | 8/2000 | Kim et al. |
| 6,417,073 | B2 * | 7/2002 | Watanabe .................... 438/424 |
| 6,451,654 | B1 | 9/2002 | Lin et al. |
| 6,531,377 | B2 | 3/2003 | Knorr et al. |
| 6,596,607 | B2 * | 7/2003 | Ahn ........................... 438/424 |
| 6,613,649 | B2 | 9/2003 | Lim et al. |
| 6,638,866 | B1 * | 10/2003 | Cheng et al. ............... 438/692 |
| 2002/0053714 | A1 | 5/2002 | Lam |
| 2002/0090797 | A1 | 7/2002 | Chen et al. |
| 2002/0123206 | A1 * | 9/2002 | Hong et al. ................ 438/424 |

(Continued)

FOREIGN PATENT DOCUMENTS

JP  02135756 A  5/1990

(Continued)

*Primary Examiner*—Brook Kebede
(74) *Attorney, Agent, or Firm*—Oblon, Spivak, McClelland, Maier & Neustadt, P.C.

(57) ABSTRACT

Forming of a first silicon oxide film is started on an internal surface of a trench formed on a surface or upwardly of a semiconductor substrate according to an HDP technique. Then, deposition of the first silicon oxide film stops before an opening of the trench closes. Further, the first silicon oxide film deposited in the vicinity of an opening is etched, and a second silicon oxide film is formed on the first silicon oxide film deposited on the bottom of the trench according to the HDP technique. In this manner, the first and second silicon oxide films can be laminated on the bottom of the trench.

8 Claims, 42 Drawing Sheets

U.S. PATENT DOCUMENTS

| | | |
|---|---|---|
| 2002/0135041 A1 | 9/2002 | Kunikiyo |
| 2003/0027404 A1 | 2/2003 | Lai et al. |
| 2003/0054608 A1 | 3/2003 | Tseng et al. |
| 2003/0062566 A1 | 4/2003 | Beintner |

FOREIGN PATENT DOCUMENTS

| | | |
|---|---|---|
| JP | 09148304 A | 6/1997 |
| JP | 2000-77404 | 3/2000 |
| KR | 2000-0059285 | 10/2000 |
| KR | 2000-0065984 | 11/2000 |
| KR | 2001-0001735 | 1/2001 |

\* cited by examiner

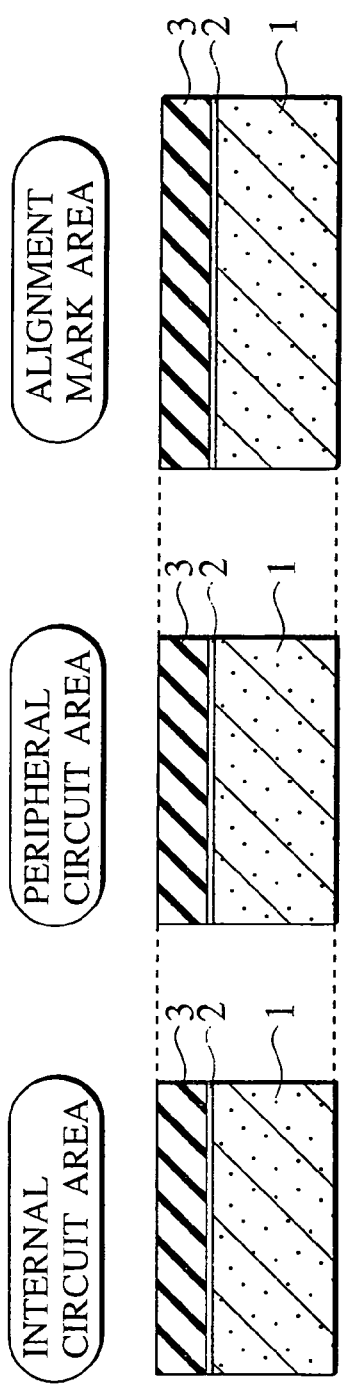
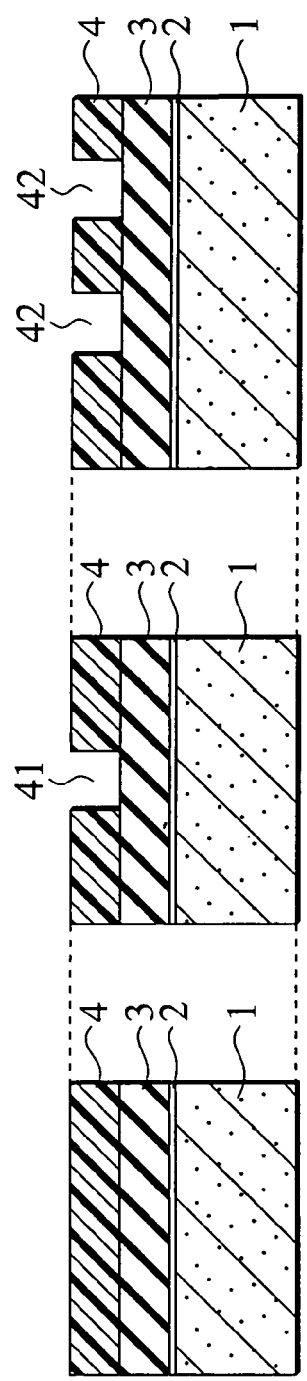
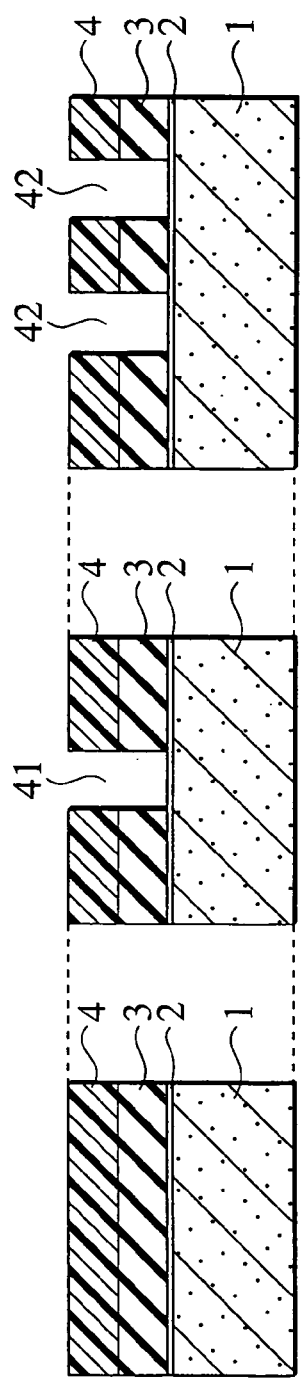
FIG.11A
FIG.11B
FIG.11C

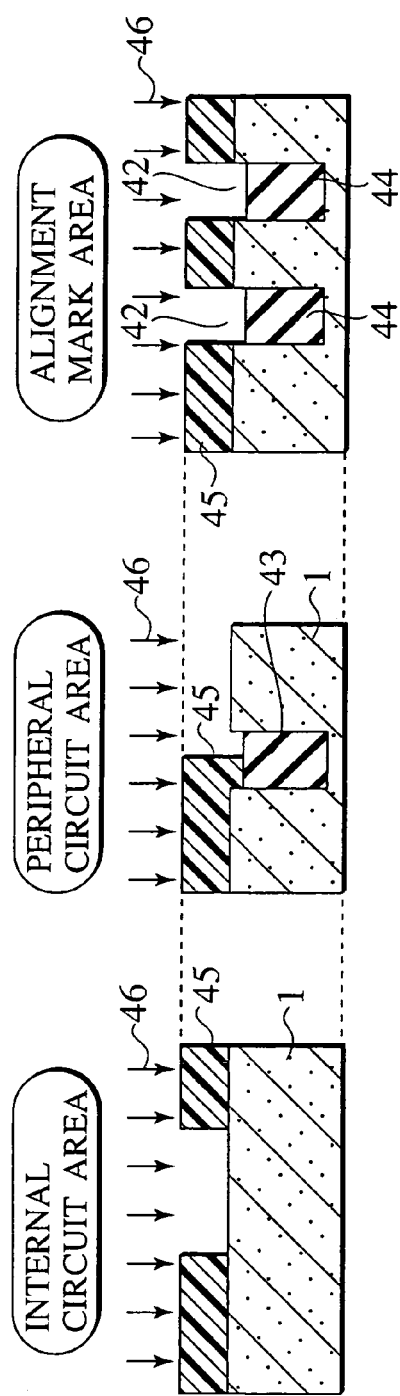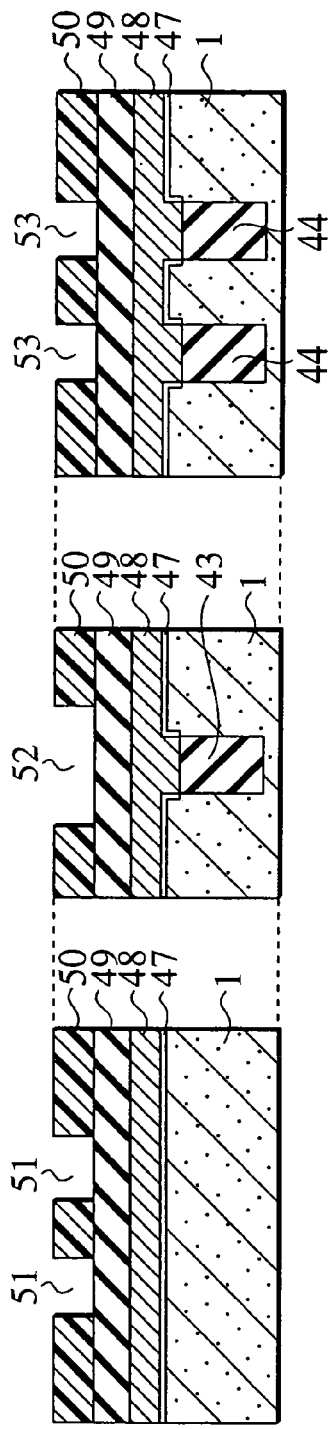

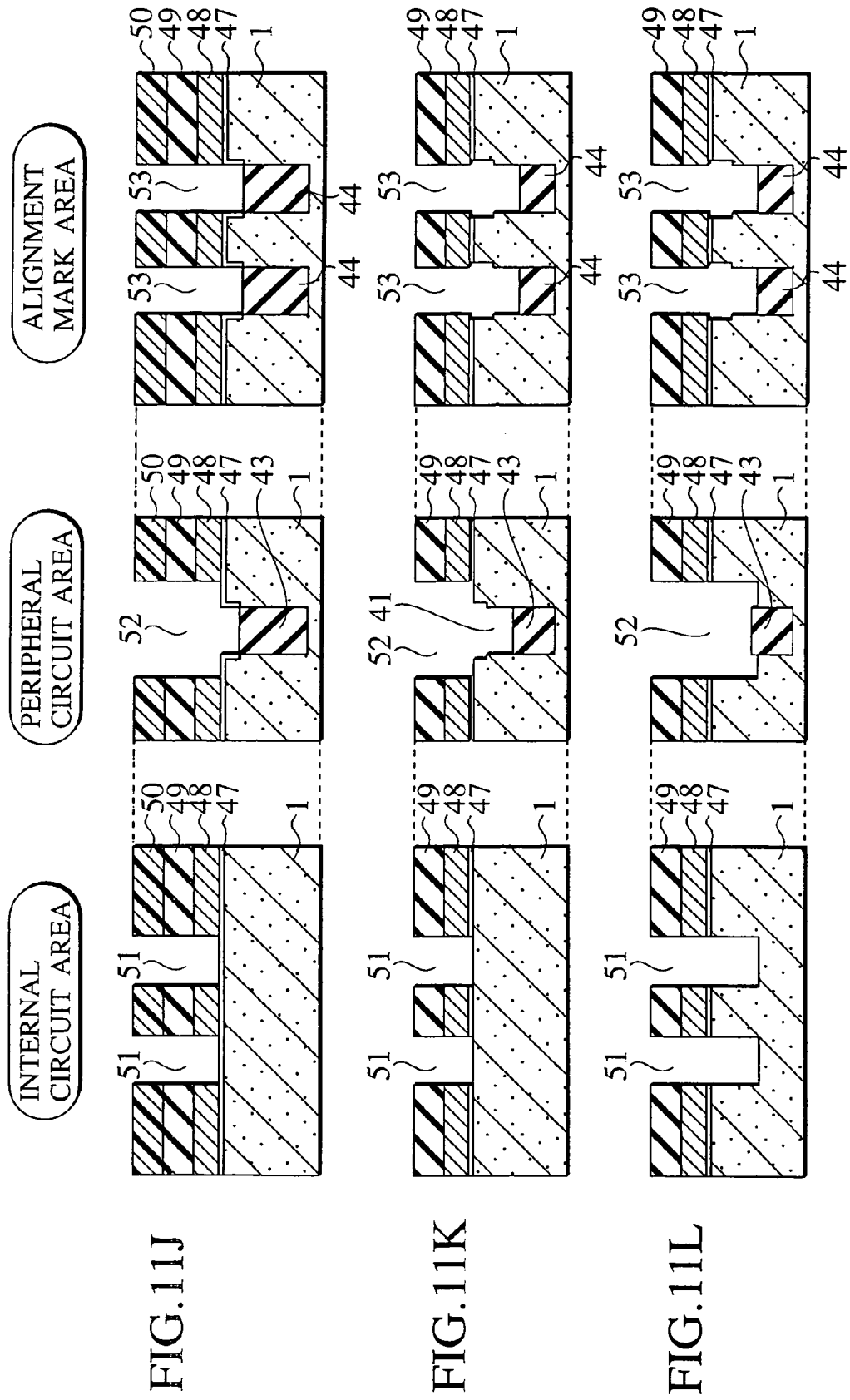

MANUFACTURING METHOD OF SEMICONDUCTOR DEVICE WITH FILLING INSULATING FILM INTO TRENCH

CROSS REFERENCE TO RELATED APPLICATIONS

This application is based upon and claims the benefit of priority from prior Japanese Patent Application P2001-286754 filed on Sep. 20, 2001; the entire contents of which are incorporated by reference herein.

BACKGROUND OF THE INVENTION

The present invention relates to a method for filling a trench that is formed in a production process of a semiconductor device. Particularly, the present invention relates to a method for filling the trench with a high aspect ratio by using a high density plasma (HDP) technique. Further, the present invention relates to the Shallow Trench Isolation (STI) technique with a high isolation resistance.

The minute isolation is required in the manufacturing of semiconductor devices, along with the shrink of the semiconductor device in recent years. STI has been used. And, the shrink of STI area is also being carried out for the same purpose. The width of the opening of the STI trench becomes narrow and the depth of it becomes deep. That is, the aspect ratio that is the ratio of the depth to the width of the opening increases. Thus, the process filling an insulator into the trench with high aspect ratio is needed in forming the STI area.

The silicon oxide ($SiO_2$) film by HDP chemical vapor deposition (CVD) (hereinafter, this silicon oxide film is called an HDP film) is filled into the high aspect trench. However, the aspect ratio of the trench of STI area increases with the further shrink of the semiconductor device in recent years. A trench exceeding a high aspect ratio of 3 is not able to fill even by the HDP film. When the HDP film is filled into the trench on a silicon substrate, the upper part of the trench is closed with the HDP film. A void results within a trench. The trench cannot completely fill.

Also, the STI area, whose width is narrow and isolation performance is high, is required in the device that uses the high voltage such as EEPROM (electrically erasable programmable read only memory). The STI area, whose width is narrow and isolation performance is high, has a deep trench. The aspect ratio of the trench becomes very high in the STI area of the cell array of the EEPROM. The filling of the HDP film into the deep trench was difficult.

SUMMARY OF THE INVENTION

A manufacturing method of a semiconductor device according to embodiments of the present invention includes forming a trench on a surface of a semiconductor substrate, oxidizing thermally a side face and a bottom face what is called internal surface of the trench, forming a first silicon oxide film into the trench with an HDP, removing the first silicon oxide film formed on the side face until a part of the side face is exposed, oxidizing thermally the part of the side face exposed, and forming a second silicon oxide film on the first silicon oxide film and on the side face with an HDP.

A manufacturing method of a semiconductor device according to embodiments of the present invention includes forming a trench on a surface of a semiconductor substrate, forming a first silicon oxide film into the trench with an HDP, removing the first silicon oxide film formed on the surface until the surface is exposed, and forming a second silicon oxide film on the first silicon oxide film and on the exposed surface with an HDP.

A manufacturing method of a semiconductor device according to embodiments of the present invention includes forming an insulating film on a semiconductor substrate, forming a polysilicon film on the insulating film, forming a trench penetrating the insulating film and the polysilicon film and dug in the semiconductor substrate, forming a thermal oxide film on an internal surface of the trench by a oxidation of an oxygen radical, and filling a first silicon oxide film into the trench with an HDP.

A manufacturing method of a semiconductor device according to embodiments of the present invention includes forming an insulating film on a semiconductor substrate, forming a polysilicon film on the insulating film, forming a trench penetrating the insulating film and the polysilicon film and dug in the semiconductor substrate, forming a first thermal oxide film and a second thermal oxide film by a thermal oxidation of the semiconductor substrate and the polysilicon film on an internal surface of the trench, forming a first silicon oxide film on the first thermal oxide film and the second thermal oxide film with an HDP, removing the first silicon oxide film formed on an upper part of the second thermal oxide film, and forming a second silicon oxide film on the first silicon oxide film with an HDP.

BRIEF DESCRIPTION OF THE DRAWINGS

FIG. 11A to FIG. 11M are sectional views showing each stage of a method for manufacturing a semiconductor device of a tenth embodiment for an isolation between an internal low voltage resistant circuit and a high voltage resistant circuit at a peripheral section, where the left side of each of these figures is a sectional view showing an internal circuit area of the semiconductor device for each manufacturing stage; the center of each of these figures is a sectional view similarly showing a peripheral circuit area, and the right side of each of these figures is a sectional view showing a mask alignment mark area.

DETAILED DESCRIPTION OF EMBODIMENTS

Figure 1A:
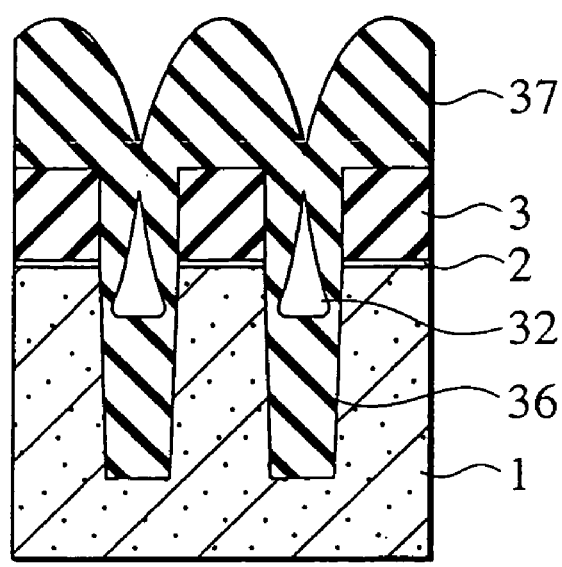
FIG. 1A and FIG. 1B are sectional views each showing an intermediate stage of manufacturing an earlier semiconductor device.
Figure 1B:
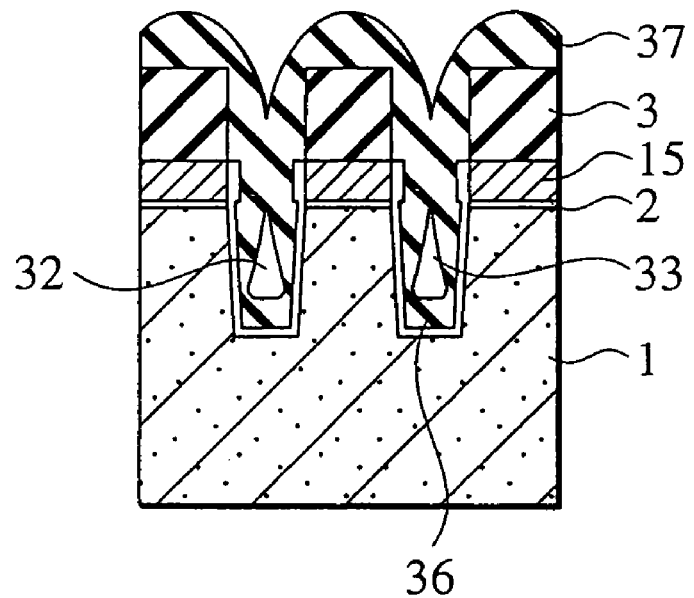

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Reason Why HDP Film Cannot Be Filled In)

A trench exceeding the high aspect rate of 3 cannot be filled in even with an HDP film 36. As shown in FIG. 1A, the HDP film 36 is filled in a trench provided on a silicon substrate 1. An HDP film 37 closes the upper part of the trench. A void 32 is formed on the HDP film 36. The trench cannot be completely filled.

The Inventor studied in earnest the reasons for the HDP film being unable to fill in a trench exceeding an aspect ratio of 3. As a result, two reasons came to light.

The first reason is that, when a trench is filled in with the HDP film, the HDP film 37 deposited onto the mask 3 is deposited at the end of the top face of the mask 3. The HDP film 7 on the end of the top face of the mask 3 is easily sputtered. The corners of the HDP film 37 become rounded. This rounded portion reflects ions flying upward, and the flying direction is changed to a diagonal direction without the ions being deposited. There is a side face of the trench, particularly a side face of the mask 3 over the trench in the changed flying direction. As shown in FIG. 1A, the HDP film 37 is deposited on an upper part of the side face. Before the HDP film 36 filled from the bottom part of the trench reaches at the upper part of the trench, the HDP film 37 on the side face grows, the trench is completely closed. A large void 32 is produced. Therefore, in forming an earlier STI area by the HDP film, the aspect ratio exceeds three. The trench is deepened and it takes longer time to fill the HDP film into the trench. The width of the opening of the trench is shortened and it takes shorter time to close the opening. And the void 32 has resulted.

The second reason is the reason why an STI trench with a structure for forming a gate electrode 15 and the STI area 36 in a self alignment manner cannot be filled. In order to prevent damage to the silicon (Si) substrate 1 when the HDP film 36 is deposited, before filling the HDP film, the internal surface of the trench is oxidized. The thickness of the silicon oxide film is about 10 nm. In this case, in an earlier oxidation method, an oxidation rate strongly depends on the crystal plane of silicon crystal. Thus, in general a polysilicon (Si) film 15 of which a variety of crystal planes are produced on a surface to be oxidized is higher than the silicon substrate in the oxidation rate. The polysilicon film 15 is greatly oxidized. Thus, an oxide film oxidized of the polysilicon film 15 extends to the center of the trench from the side face of the trench. The opening of the trench is narrowed, and it is difficult to fill the HDP film into the trench.

First Embodiment

In the first to seventh embodiments, the present invention was applied to filling of a trench of an STI area of a semiconductor device.

A method for manufacturing a semiconductor device of the first embodiment will be described by referring to FIG. 2A to FIG. 2K. The semiconductor device manufacturing method of the first embodiment is directed to a method for filling in with a HDP film a trench with a high aspect ratio. First, the trench with the high aspect ratio is filled from the start to the partway with a HDP film. Next, HDP film deposited on the side face by reflection is removed once. Once again, the HDP film is deposited. A trench with a high aspect ratio can be filled in the HDP film.

Figure 2A:
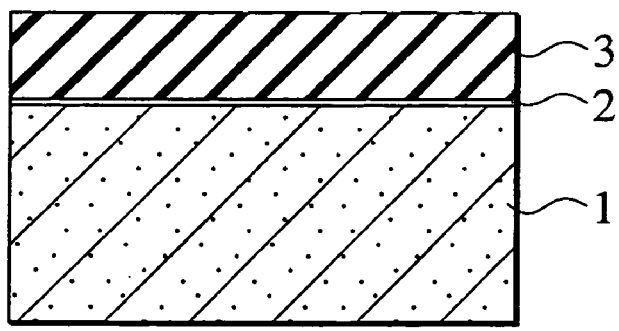
FIG. 2A to FIG. 2K are sectional views showing each stage of a method for manufacturing a semiconductor device of a first embodiment.

(1) First, as shown in FIG. 2A, a buffer oxide film 2 is formed on a semiconductor substrate 1 according to a thermal oxidation method. Next, as a mask 3, for example, a silicon nitride ($Si_3N_4$) film is formed according to a low pressure (LP) CVD technique.

Figure 2B:
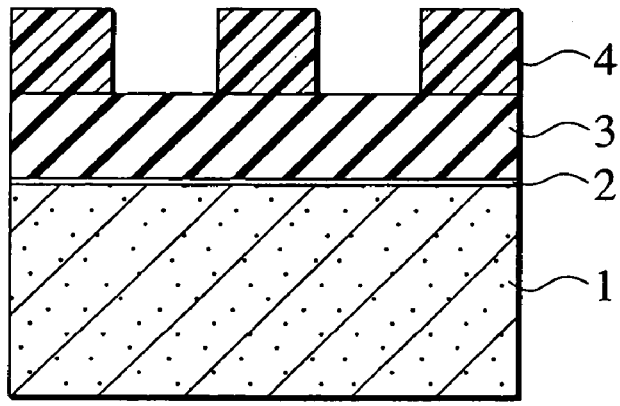

(2) As shown in FIG. 2B, a photo resist pattern 4 is formed on a portion serving as an element area according to a photo lithography technique.

Figure 2C:
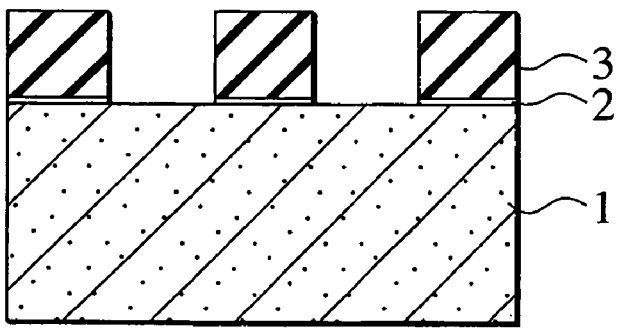

(3) Next, as shown in FIG. 2C, the mask 3 is etched using the photo resist 4 as a mask, and then, a buffer insulating film 2 is etched.

Figure 2D:
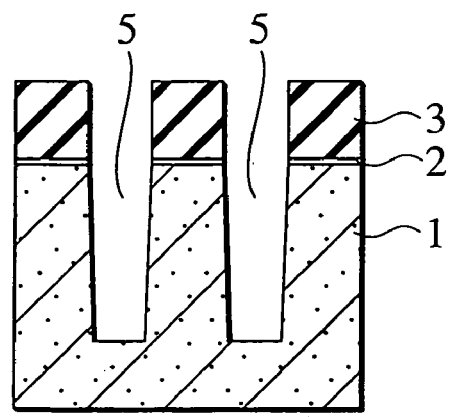

(4) Further, as shown in FIG. 2D, the semiconductor substrate 1 is etched using the mask 3 as a mask, thereby forming a trench 5 with the high aspect ratio of 5 or more which serves as an isolation area. The opening width of the trench is about 100 nm, for example.

Figure 2E:
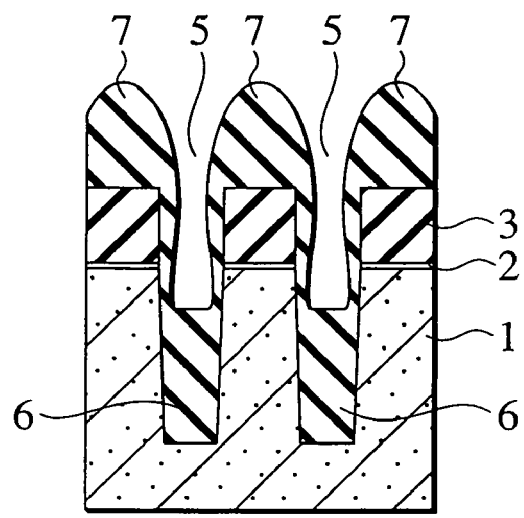

(5) Then, as shown in FIG. 2E, an HDP film 6 is filled in the trench 5. When the temperature of substrate 1 is increased to approximately 650° C., filling characteristics can be optimized. First, the HDP films 6 and 7 are deposited immediately before the HDP film 7 deposited at the upper part of the side face of the trench 5 closes the opening to the trench 5. For example, if the HDP film 6 and 7 of the thickness about 300 nm is deposited, the depth filled in with the HDP film 6 is also about 300 nm, the film thickness of the HDP film 7 on the side face is about 30 nm, which is about ⅒ thereof. If the film 7 of 30 nm is deposited on the side faces at both sides of the trench 5 of 100 nm in opening width, the remaining opening is 40 nm. In order to prevent damage to the silicon substrate 1 when the HDP film 6 is deposited, before filling in with the HDP film 6, the inside of this trench 5 may be oxidized to an oxidation film thickness of about 10 nm.

Figure 2F:
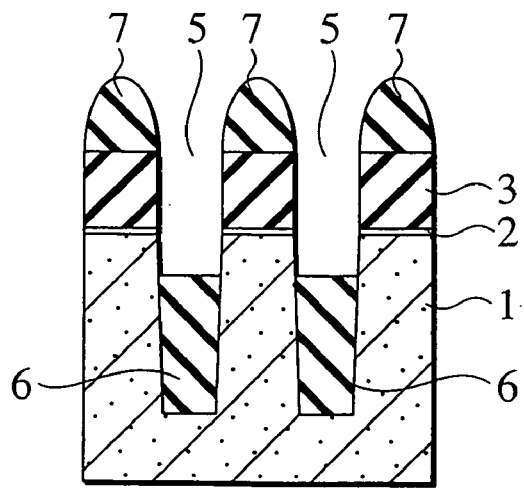

(6) As shown in FIG. 2F, by using a wet etching with diluted hydrofluoric acid, chemical dry etching (CDE) or hydrogen fluoride vapor phase cleaning (VPC), the HDP film 7 deposited on the side faces is removed by etching until the side face of the trench 5 has been exposed. At the same time, the full surface of each the HDP films 6 and 7 are etched in an isotropic manner, and the top surface of the HDP film 6 is also retracted to some extent. However, etching to an extent can ensure substantial film thickness such that the HDP film 7 of the side face is removed. For example, if the 30 nm thick film 7 on the side face part is removed, the upper part of the film 6 is removed by a depth of about 30 nm. However, this elimination is merely 10% of the 300 nm original depth, and a depth of 270 nm is left.

Therefore, after the HDP film 7 deposited on the side faces has been removed, the HDP film 6 is deposited on the bottom of the trench 5 at a substantial film thickness. If a HDP film 8 is further deposited in this state, it is possible to fill in a trench 5 exceeding an aspect ratio of 3 in the HDP film without void.

Figure 2G:
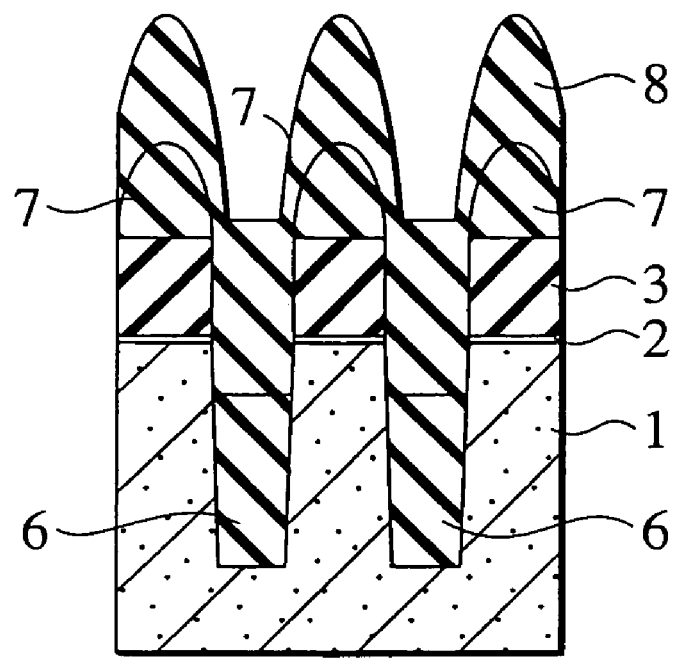

(7) As shown in FIG. 2G, the HDP film 8 is further deposited. In depositing the HDP film 8, the trench 5 is filled in with the HDP film 6, and the aspect ratio is lowered. Thus, no void is produced in the trench 5. In the trench with very high aspect ratio, if a void is produced again during the second deposition of the HDP film 8, the HDP film 8 is deposited again before the HDP film 8 on the side faces closes up the opening of the trench 5. The HDP film 8 on the side faces is etched, and again, another HDP film is deposited. Then, by repeating this procedure of deposition and etching, it is possible to completely fill in the trench 5 with the HDP films 6 and 8.

Figure 2H:
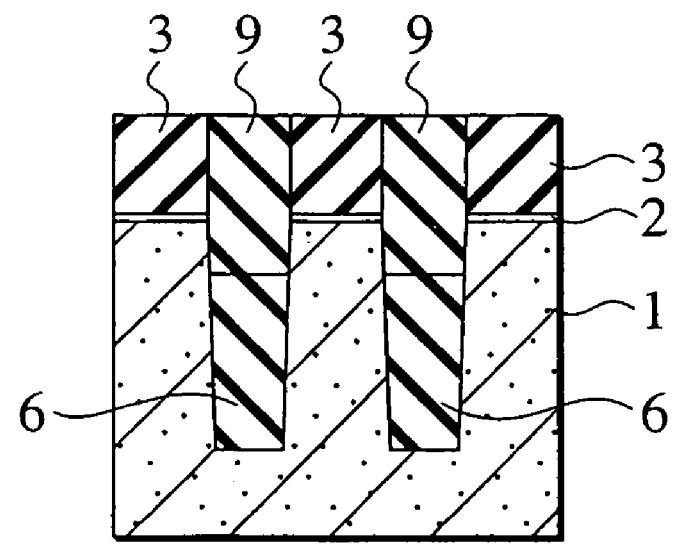

(8) Then, as shown in FIG. 2H, silicon oxide films 8 and 7 are polished up to the height of the mask 3 according to a chemical mechanical polishing (CMP) technique.

Figure 2I:
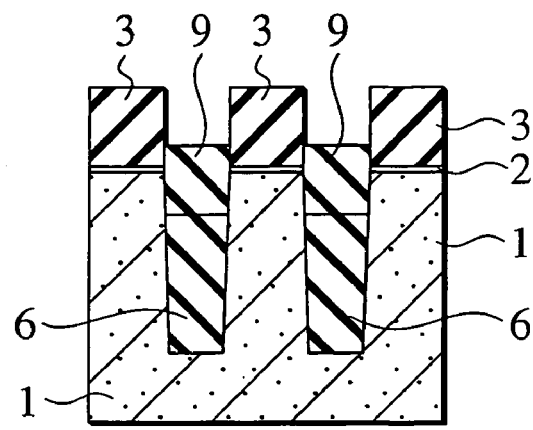
Figure 2J:
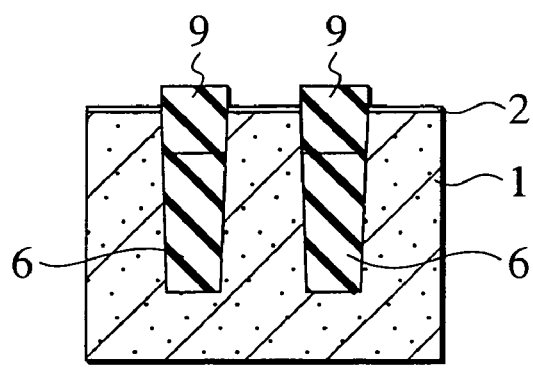
Figure 2K:
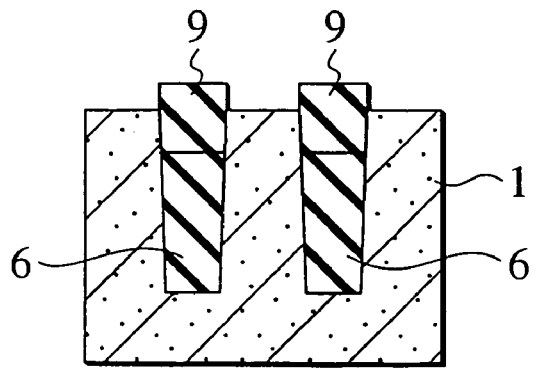

(9) As shown in FIG. 2I, the surface of an oxide film 9 is then lowered by an etching treatment using diluted hydrofluoric acid (HF). Then, as shown in FIG. 2J, the mask 3 is removed. Lastly, as shown in FIG. 2K, the buffer oxide film 2 is removed. In this way, the STI areas 6 and 9 can be formed.

A hydrofluoric acid etching rate of the HDP films 6 and 9 without heat treatment after deposition is equal to that of a thermal oxide film. The HDP films 6 and 9 are uniform, fine, and free from humidification. In this respect, unlike a silicon oxide film formed according to an earlier CVD technique or spin-on glass (SOG) technique, these HDP films 6 and 9 are suitable for the insulating film of the STI area. In addition, there is an advantage in that the trench with an aspect ratio of about 3 can be filled, and these HDP films have been optimal for use as such STI insulating film. According to the manufacturing method of the semiconductor device of the first embodiment, it is possible to fill in with a HDP film the trench with a high aspect ratio exceeding 3 which cannot be filled in the earlier HDP film. Then, an STI area with a high aspect ratio exceeding 3 resulting from the shrink of semiconductor devices can be manufactured using the HDP film.

FIG. 2K is a sectional view showing a semiconductor device of the first embodiment. The semiconductor device of the first embodiment is composed of a semiconductor substrate 1, a bottom insulator 6, and an upper insulator 9. The semiconductor substrate 1 has a trench 5 formed on the surface. The upper insulator 9 has a bottom face that comes into contact with the upper face of the bottom insulator 6 and a side face that comes into contact with the side face of the trench 5. The upper insulator 9 has a bottom face that comes into contact with the upper face of the bottom insulator 6 and a side face that comes into contact with the side face of the trench 5. The insulators 6 and 9 are laminated and filled into the trench 5, whereby the insulators 6 and 9 serve as an isolation area.

Second Embodiment

In the first embodiment, in the shape produced after the HDP film 7 on the side face of the trench 5 has been etched, the HDP film 7 deposited on the mask 3 is rounded as shown in FIG. 2F. When the second HDP film 8 is deposited, ions which fly upward from this rounded diagonal point are reflected. The rounded HDP film 7 enables the deposition on the side faces of the trench 5. Thus, the limit for filling the void-free trench 5 with the HDP film 8 on the second filling is inferior to the limit of filling a void-free simple trench with no rounding. In order to further increase the filling limit for when the second HDP film 8 is deposited, the following process is added before depositing the second HDP film 8.

Hereinafter, a method for manufacturing a semiconductor device according to a second embodiment will be described. The semiconductor device manufacturing method according to the second embodiment is identical to that according to the first embodiment in the stages (1) to (6) shown in FIG. 2F.

Figure 3A:
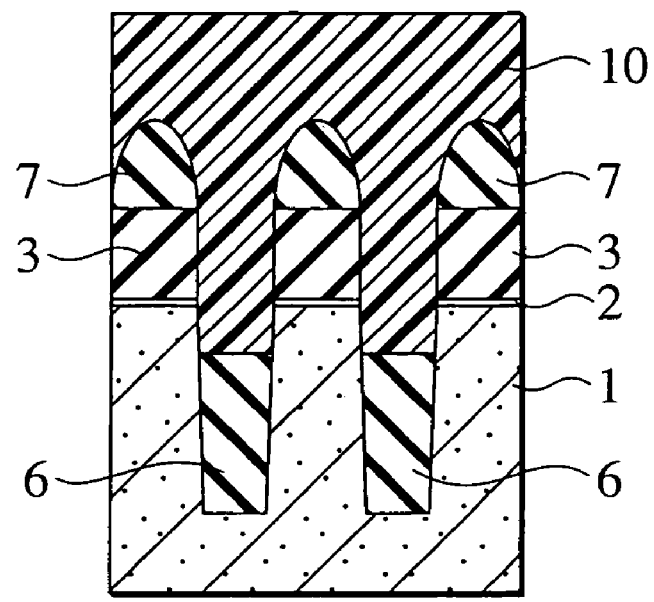
FIG. 3A to FIG. 3E are sectional views showing each stage of a method for manufacturing a semiconductor device of a second embodiment.

(1) Next, as shown in FIG. 3A, a photo resist 10 is applied.

Figure 3B:
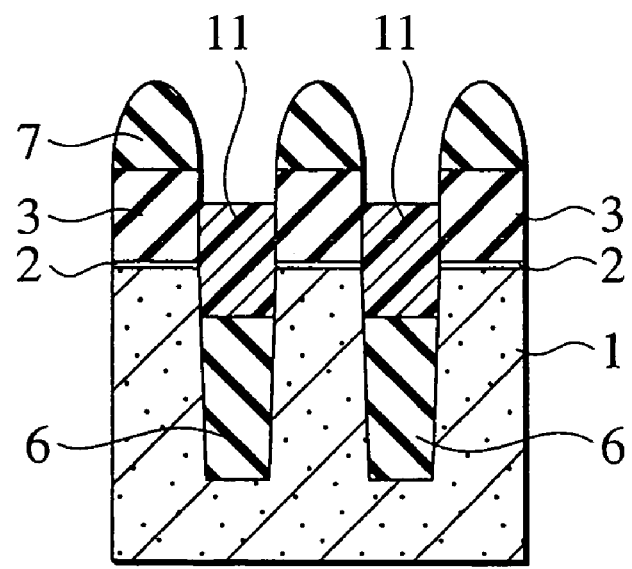

(2) When this resist 10 is exposed and developed to some extent, as shown in FIG. 3B, a resist 11 can be lowered so that only the resist 11 in the trench 5 remains. In addition, this lowering can be achieved by fully etching back the resist 10 according to a CDE technique.

Figure 3C:
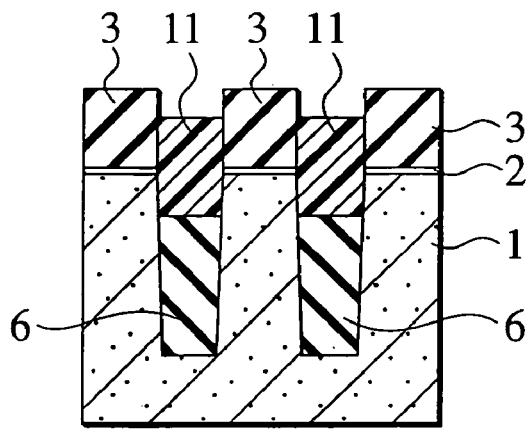

(3) As shown in FIG. 3C, only the HDP film 7 on the mask 3 at the opening face of a so called trench 5 is selectively removed according to diluted hydrofluoric acid wet etching treatment or a CDE technique, until this opening face is exposed.

Figure 3D:
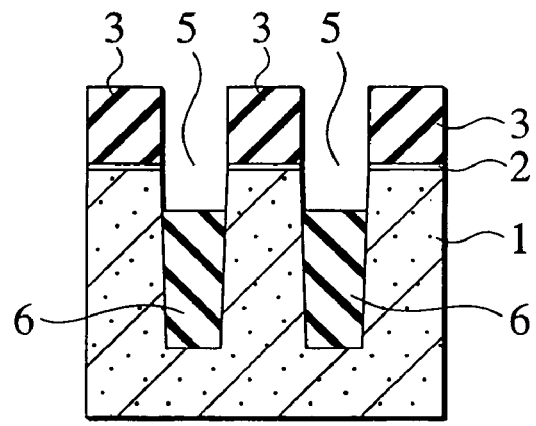

(4) As shown in FIG. 3D, the photo resist 11 in the trench 5 is selectively removed according to the CDE technique.

Figure 3E:
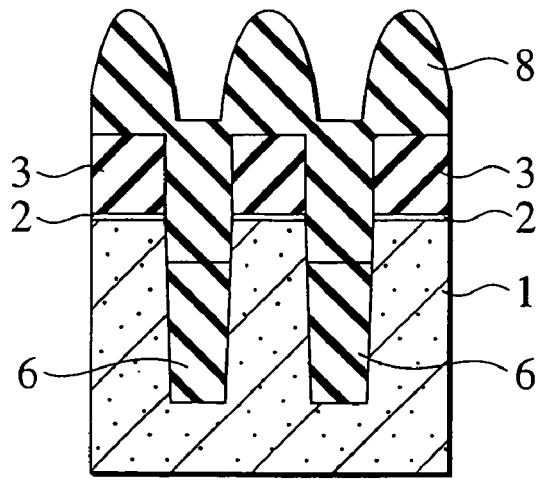

(5) As shown in FIG. 3E, the HDP film 8 is further deposited. In deposition of the HDP film 8, there is no rounded HDP film 7 formed on the mask 3. Thus, after the HDP film 6 has been deposited on the bottom of the trench 5, if the aspect ratio of a trench free of being filled is 3 or less, the trench can be completely filled in the second filling of the HDP film 8. In a trench with a very high aspect ratio, if a void is produced again when the second HDP film 8 is deposited, the manufacturing method of the second embodiment is repeated again, thereby making it possible to completely fill a trench with the HDP film.

Lastly, as in the first embodiment, as shown in FIG. 2H in the stage (8), a silicon oxide film 8 is polished according to the CMP technique down to the height of the mask 3. As shown in FIG. 2I to FIG. 2K of the stage (9), the surface of the oxide film 9 is lowered, the mask 3 is removed, and the buffer oxide film 2 is removed. Accordingly, the STI areas 6 and 9 can be formed.

Third Embodiment

Figure 4A:
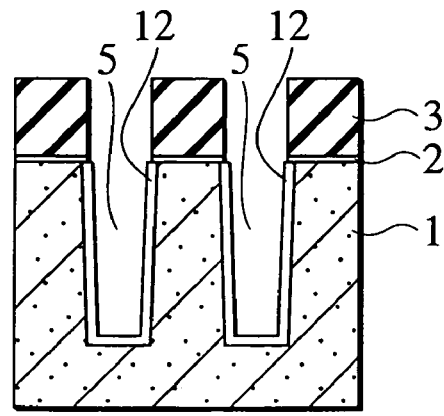
FIG. 4A to FIG. 4H are sectional views showing each stage of a method for manufacturing a semiconductor device of a third embodiment.
Figure 4B:
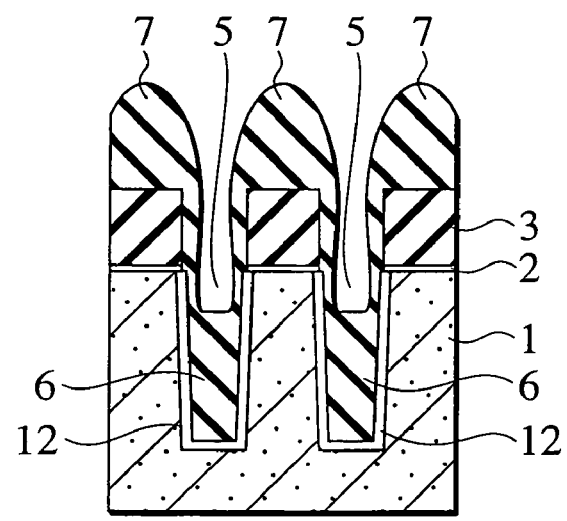
Figure 4C:
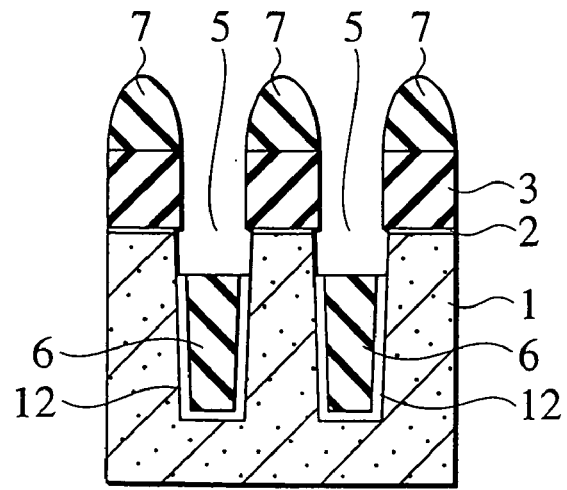
Figure 4D:
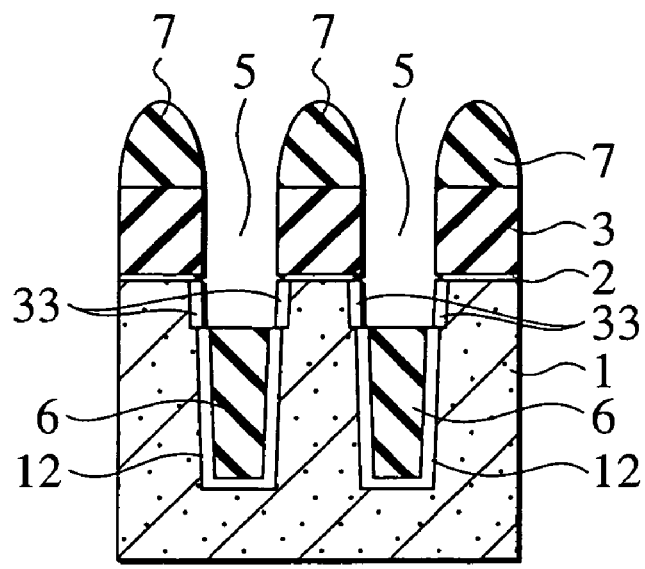
Figure 4E:
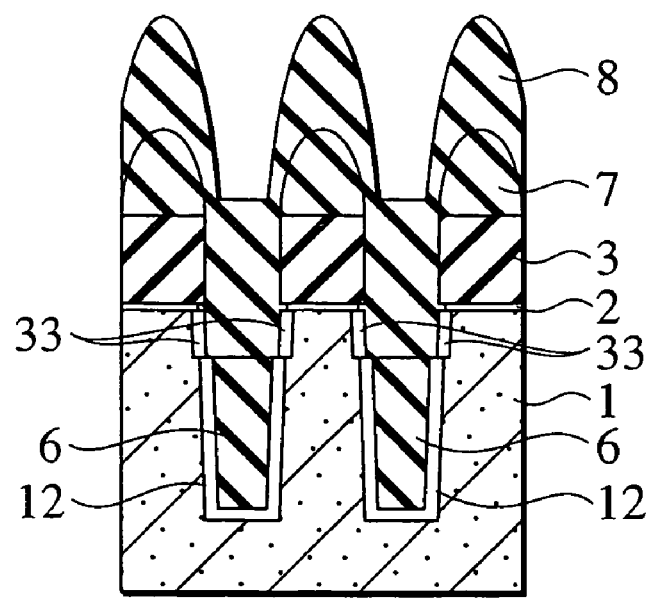

In the third embodiment, there is provided a semiconductor device manufacturing method capable of preventing damage to the silicon substrate 1 when the HDP film 6 is deposited. As a first stage, before filling with the HDP film 6, the internal surface of the trench 5 is oxidized by the oxidation film thickness to about 10 nm, and the oxide film 12 is formed, as shown in FIG. 4A. As shown in FIG. 4C, in removing the HDP film 7 deposited on the side face, the oxide film 12 located at the upper part in such trench 5 is also reduced at the same time. If the second HDP film 8 is deposited in this state, a silicon substrate 1 is exposed during the second deposition, thus making it impossible to prevent damage to the silicon substrate 1 when the HDP film 8 is deposited. Therefore, as a countermeasure against damage at the second stage, before filling with the second HDP film 8, as shown in FIG. 4D, the oxidation of the exposed silicon substrate 1 is carried out again, and the oxide film 33 with 10 nm thickness is formed. Countermeasures against damage at these two stages are added to the semiconductor device manufacturing method, thereby making it possible to prevent damage to the silicon substrate 1 when the HDP films 6 and 8 are deposited.

Figure 4F:
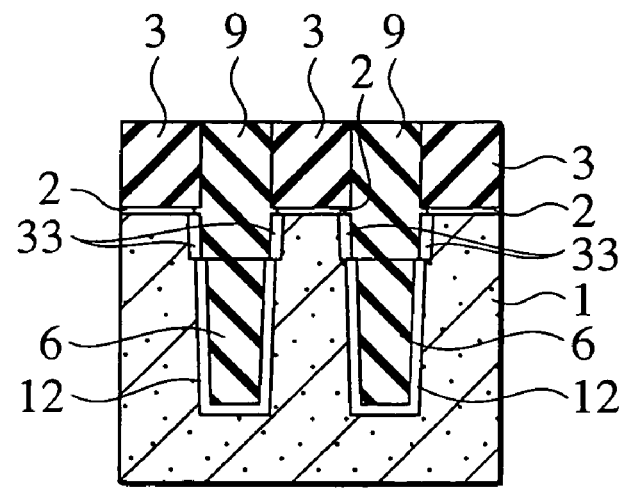
Figure 4G:
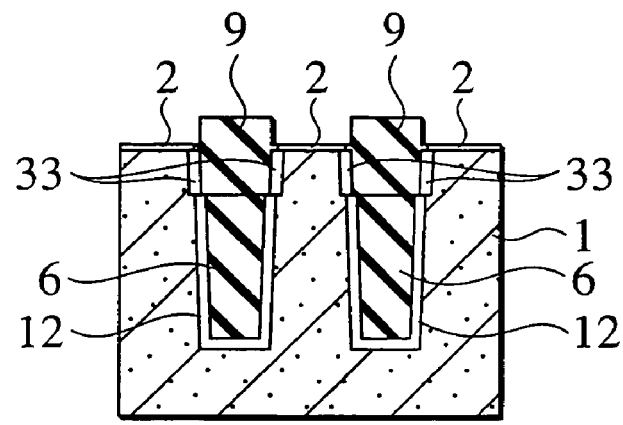
Figure 4H:
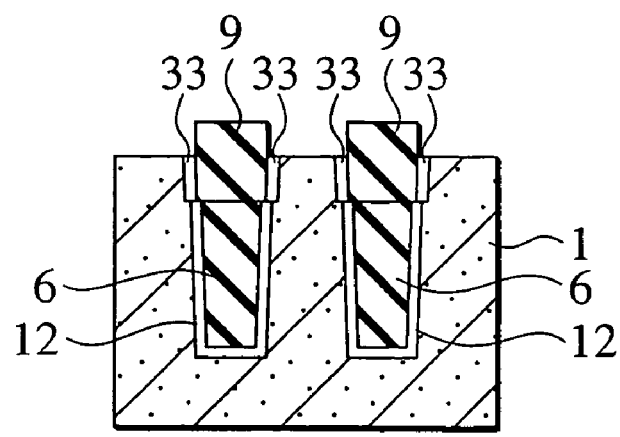

Lastly, as in FIG. 2H of the stage (8) according to the first embodiment, as shown in FIG. 4F, the silicon oxide films 8 and 7 are polished according to the CMP technique so that the height of the surface of the silicon oxide films 8 and 7 is equal to that of the mask 3. As in FIG. 2I to FIG. 2K of the stage (9), first, as shown in FIG. 4G, the surface of the oxide film 9 is lowered, and the mask 3 is removed. As shown in FIG. 4H, the buffer oxide film 2 is removed. In doing this, the STI areas 6 and 9 can be formed.

The semiconductor device according to the third embodiment, as shown in FIG. 4H, has a semiconductor substrate 1, an insulating film 12, a bottom insulator 6, an insulating film 33, and an upper insulator 9. The semiconductor substrate 1 has a trench 5 on the surface. The insulating film 12 has a bottom face that comes into contact with the bottom face of the trench 5 and with the lower part of the side face of the trench 5. The bottom insulator 6, at the bottom face and the side face, comes into contact with the surface of the insulating film 12. The insulating film 33, at the back face, comes into contact with the upper part of the side face of the trench 5, and the insulation film, at the end face, comes into contact with that of the insulating film 12. The upper insulator 9, at the side face, comes into contact with the surface of the insulating film 33. The upper insulator 9, at the bottom face, contacts with the upper face of the bottom insulator 6.

The semiconductor device of the third embodiment is useful when the trench 5 of the semiconductor substrate 1 exceeds an aspect ratio of about 3. The insulating films 12 and 33 is formed on the surface of the trench 5 formed on the surface of the semiconductor substrate 1, the insulators 6 and 9 are laminated and filled into the inside of the trench 5, whereby the STI area 6, 9, 12 and 33 can be formed.

Fourth Embodiment

In the fourth embodiment, as in the third embodiment, an object of the present embodiment is to prevent damage to the silicon substrate 1 when the HDP film is deposited. In particular, in the case where the inside of the trench 5 is oxidized before filling the HDP film 6, when the HDP film 7 deposited on the side faces is removed, the oxide film 12 formed in the trench 5 before filling the HDP film 6 is also removed at the same time. If the second HDP film is deposited in this state, the silicon substrate 1 is exposed during the second deposition, thus making it impossible to prevent damage to the silicon substrate 1 when the HDP film 8 is deposited.

Figure 5A:
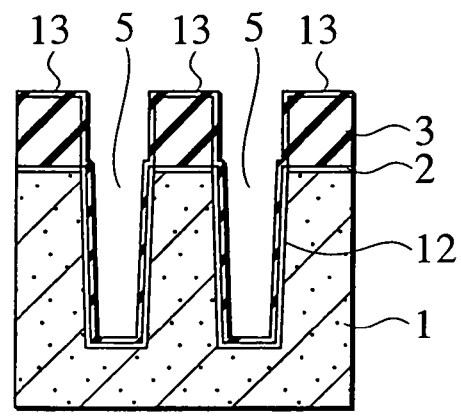
FIG. 5A to FIG. 5K are sectional views showing each stage of a method for manufacturing a semiconductor device of a fourth embodiment.

Therefore, in the case where the inside of the trench 5 is oxidized, after the oxidation stage shown in FIG. 4A of the third embodiment, additionally, as shown in FIG. 5A, a silicon nitride film (Si3N4) is deposited by about 10 nm, or preferably, 6 nm according to the LPCVD technique. Then, manufacturing is carried out as follows in the first and second embodiments.

Figure 5B:
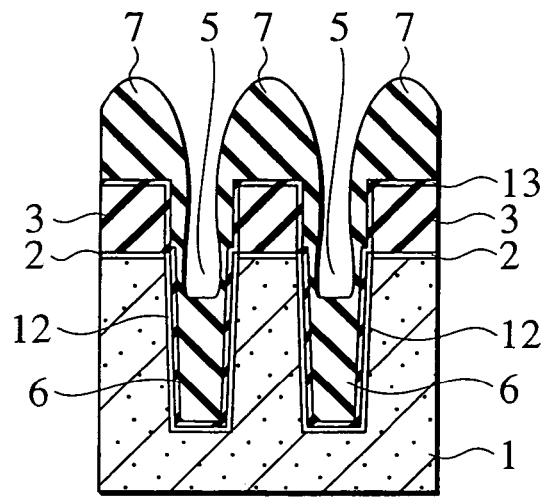
Figure 5C:
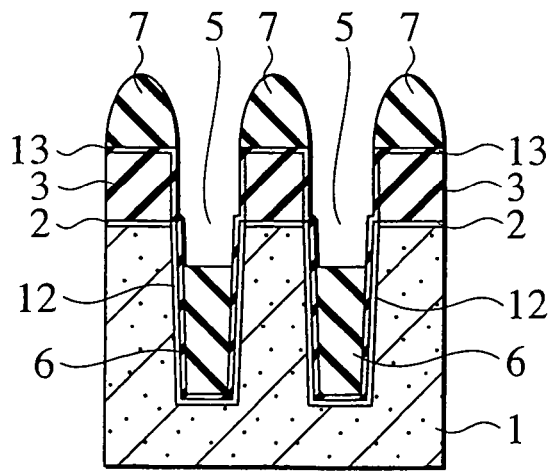

(1) As shown in FIG. 5B, HDP films 6 and 7 are deposited in this trench 5. (2) As shown in FIG. 5C, the HDP film 7 deposited on the side faces is removed by etching. The HDP film 7 is etched while selectivity is provided by a silicon nitride film 13, due to etching processing such as with a diluted hydrofluoric acid, whereby the silicon oxide film 12 formed on the side face of the trench 5 before filling the HDP film 6 remains without being etched.

Figure 5D:
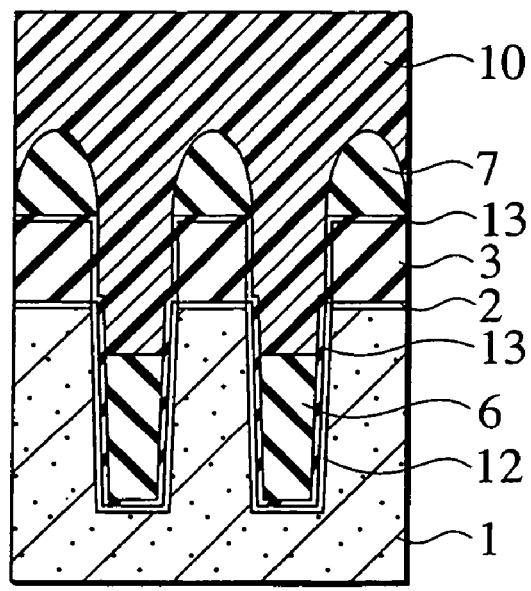
Figure 5E:
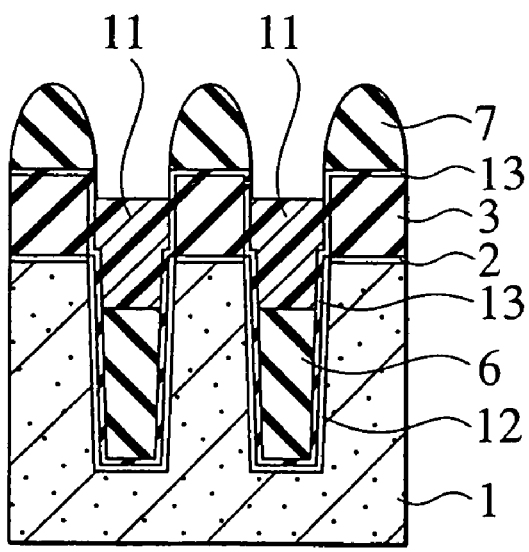
Figure 5F:
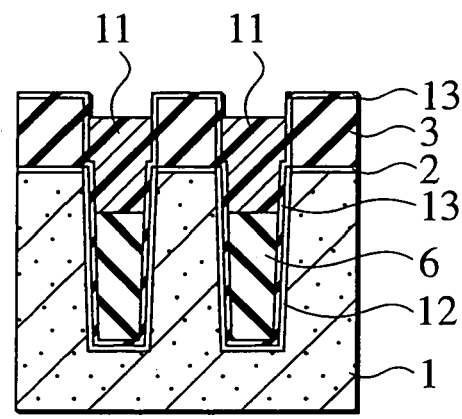
Figure 5G:
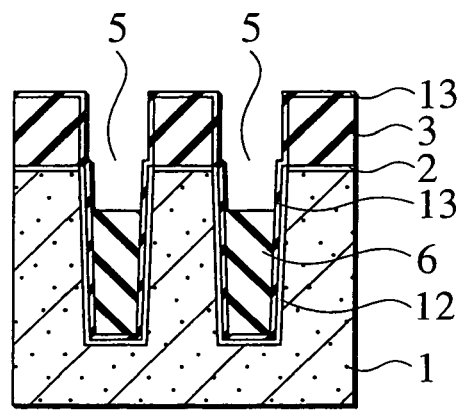
Figure 5H:
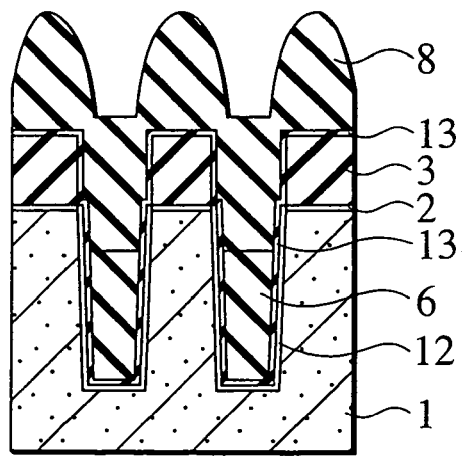
Figure 5I:
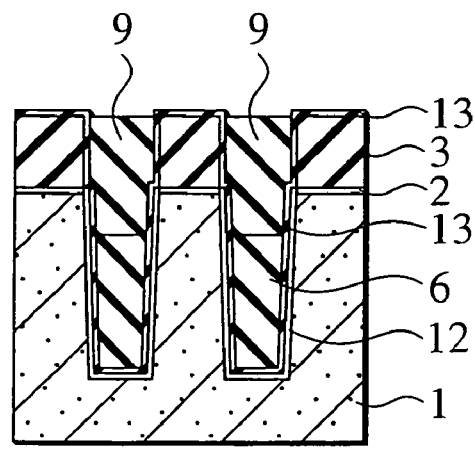

(3) Next, as shown in FIG. 5D, a photo resist 10 is applied. (4) As shown in FIG. 5E, a photo resist 11 remains only in the trench 5. (5) As shown in FIG. 5F, only the HDP film 7 that is on the mask 3 is removed. (6) As shown in FIG. 5G, the photo resist 11 in the trench 5 is removed. (7) As shown in FIG. 5H, an HDP film 8 is further deposited. (8) As shown in FIG. 5I, a silicon oxide film 8 is polished according to the CMP technique down to the height of the mask 3.

Figure 5J:
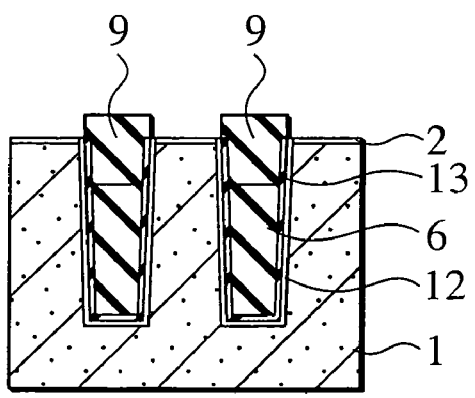
Figure 5K:
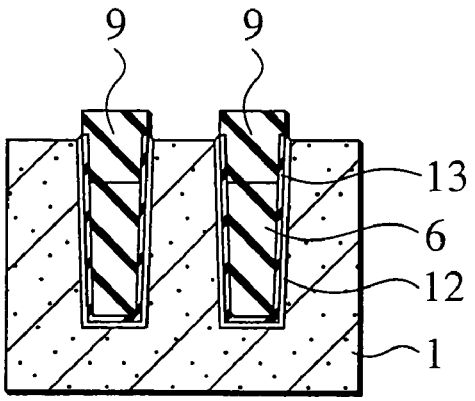

(9) As shown in FIG. 5J and FIG. 5K, the surface of the oxide film 9 is lowered, the mask 3 is removed, and the buffer oxide film 2 is removed. Accordingly, the STI areas 6 and 9 can be formed. In addition, a layer damaged by formation of the HDP film is not formed in the substrate 1.

The semiconductor device according to the fourth embodiment, as shown in FIG. 5K, is composed of: a semiconductor substrate 1; a silicon oxide film 12; a silicon nitride film 13; a bottom insulator 6; and an upper insulator 9. The semiconductor substrate 1 has a trench 5 on the surface. The silicon oxide film 12 has a back face that comes into contact with the bottom face and side face of the trench 5. The silicon nitride film 13, at the back face, comes into contact with the surface of the silicon oxide film 12. The bottom insulator 6, at the bottom face and side face, comes into contact with the surface of the silicon nitride film 13. The upper insulator 9, at the side face, comes into contact with the surface of the silicon nitride film 13, and the upper insulator 9, at the bottom face, comes into contact with the upper face of the bottom insulator 6.

The semiconductor device of the fourth embodiment is useful when the trench 5 of the semiconductor substrate 1 exceeds the aspect ratio of about 3. The insulating films 12 and 13 laminated on the surface of the trench 5 formed on the surface of the semiconductor substrate 1 are formed, the insulators 6 and 9 are filled into and laminated inside of the trench, whereby an STI area 6 and 9 can be formed.

Fifth Embodiment

When STI area is formed in the fourth embodiment, as shown in FIG. 5K, the STI internal surfaces formed with a laminate of a thin silicon oxide film 12 and a thin silicon nitride film 13 on the inside. In this case, charge can be trapped at the interface state of an oxide film 12—nitride film 13 interface. Such charge, in particular, a charge located in the vicinity of the surface of the substrate 1 affects the electric field of an element area. There is a possibility that an unexpected behavior can be produced in the operation of a semiconductor device.

As a result, in the fifth embodiment, in order to avoid the above described concern, the silicon nitride film 13 located in the vicinity of the surface of the substrate 1 is removed.

Figure 6A:
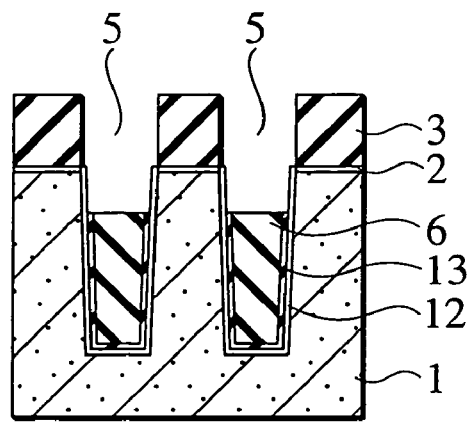
FIG. 6A to FIG. 6F are sectional views showing each stage of a method for manufacturing a semiconductor device of a fifth embodiment.
Figure 6B:
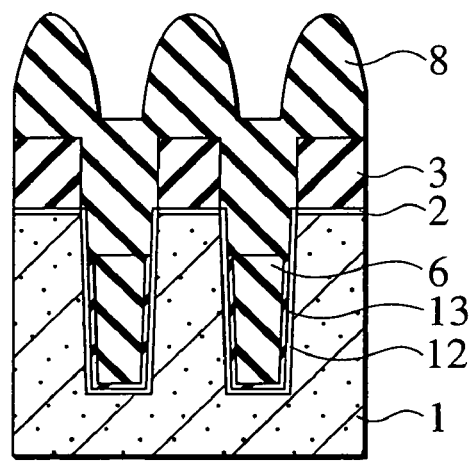
Figure 6C:
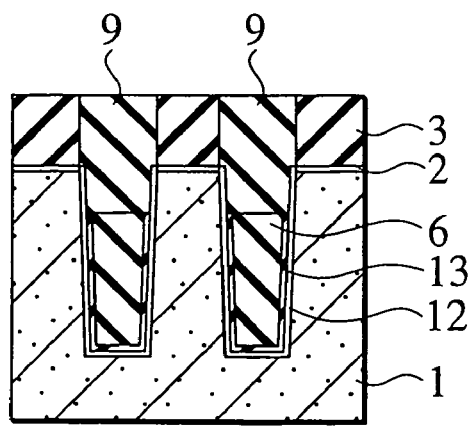
Figure 6D:
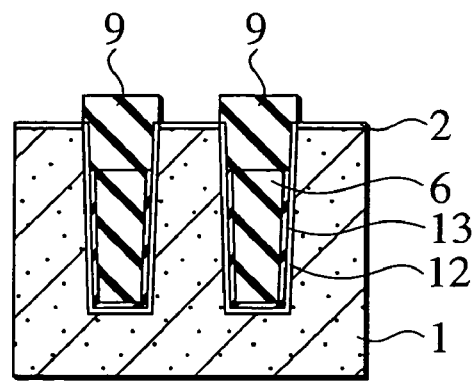
Figure 6E:
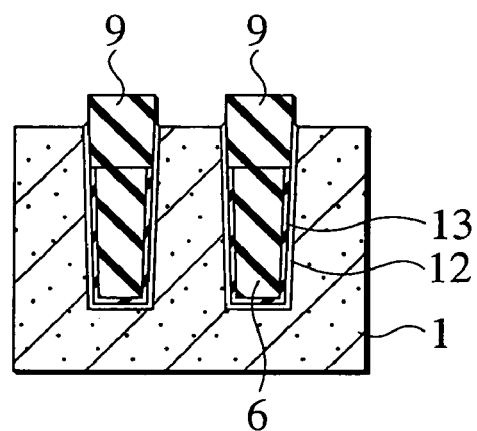

That is, after removing the photo resist 11 in the trench 5 shown in FIG. 5G of the fourth embodiment, as shown in FIG. 6A, the exposed silicon oxide film 13 is removed. As shown in FIG. 6B, the HDP film 8 is additionally deposited. As shown in FIG. 6C, the silicon oxide film 8 is polished according to the CMP technique down to the height of the mask 3. As shown in FIG. 6D, the surface of the oxide film 9 is lowered, and the mask 3 is removed. As shown in FIG. 6E, the buffer oxide film 2 is removed. In doing this, the isolation areas 6 and 9 caused by STI area can be formed.

Figure 6F:
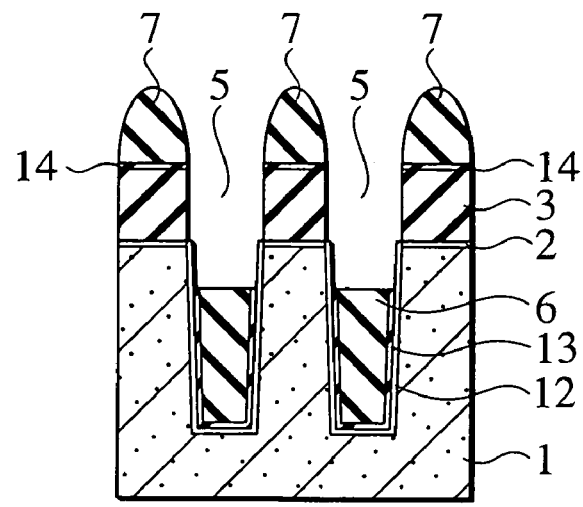

After removing the film 7 on the side face of the trench 5 shown in FIG. 5C of the fourth embodiment, as shown in FIG. 6F, the exposed silicon nitride film 13 may be removed. In order to remove the film 13, etching may be carried out with hot phosphoric acid. Then, the second HDP film 8 is deposited, whereby the above described concern can be avoided.

The semiconductor device according to the fifth embodiment, as shown in FIG. 6E, is composed of: a semiconductor substrate 1; a silicon oxide film 12; a silicon nitride film 13; a bottom insulator 6; and an upper insulator 9. The semiconductor substrate 1 has a trench 5 on the surface. The silicon oxide film 12 has a back face that comes into contact with the bottom face and side face of the trench 5. The silicon nitride film 13, at the back face, comes into contact with the surface of the silicon oxide film 12. The bottom insulator 6, at the bottom face and side face, comes into contact with the surface of the silicon nitride film 13. The upper insulator 9, at the side face, comes into contact with the surface of the silicon oxide film 12, and the upper insulator 9, at the bottom face, comes into contact with an upper face of the bottom insulator 6 and an end face of the silicon nitride film 13.

The semiconductor device of the fifth embodiment is useful when the trench 5 of the semiconductor substrate 1 exceeds an aspect ratio of about 3. The insulating films 12 and 13 laminated on the surface of the trench 5 formed on the surface of the semiconductor substrate 1 are formed, and the insulators 6 and 9 are filled in and laminated inside of the trench, whereby the STI area 6 and 9 can be formed.

Sixth Embodiment

Figure 7A:
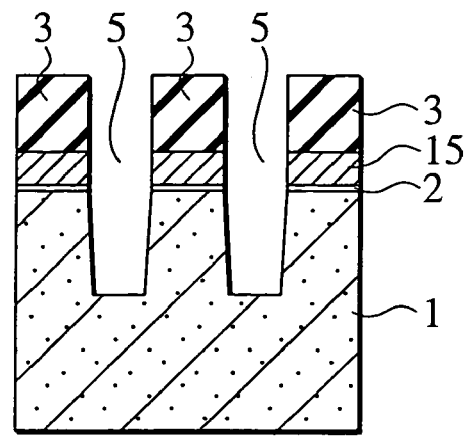
FIG. 7A to FIG. 7F are sectional views showing each stage of a method for manufacturing a semiconductor device of a sixth embodiment.

The sixth embodiment can be applied to a method for manufacturing a non-volatile memory cell. In the sixth embodiment, a gate electrode 15 consisting of polysilicon of FIG. 7A is formed in a self alignment manner together with the trench 5 which serves as STI area. In doing this, the aspect ratio of the trench 5 is increased. A method for filling the trench 5 will be described. The sixth embodiment can be applied to an electric field effect transistor (FET) or the like without being limited to a nonvolatile memory cell.

First, as shown in FIG. 7A, on the silicon substrate 1, there are sequentially laminated: an oxide film 2 of 10 nm thick that serves as a tunnel oxide film with the nonvolatile memory cell; polysilicon 15 that serves as a part of a floating gate; and a silicon nitride film that serves as a cap 3.

Next, the trench 5 is dug in an area serving as an isolation area according to a lithography process and etching. Specifically, the cap 3, the floating gate 15, the silicon oxide film 2, and substrate 1 are sequentially etched. The isolation trench 5 and the films 3 and 15 are formed in a self alignment manner. A depth of the isolation trench 5 to be dug in the substrate 1 is obtained as a depth of 300 nm, for example.

Figure 7B:
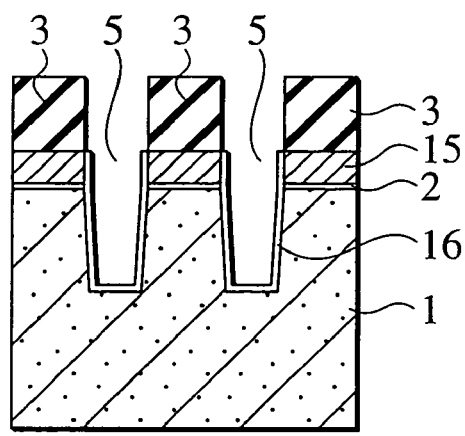

Next, as shown in FIG. 7B, in order to prevent damage to the substrate 1 when the HDP film 8 is deposited, before filling with the HDP film 8, the inside of the trench 5 is oxidized in advance of a thickness of about 10 nm. This oxidation is carried out by ozone (O3) oxidation. In a general thermal oxidation technique using oxygen or vapor deposition, polysilicon 15 has a higher oxidation rate than the silicon substrate 1, and polysilicon 15 is oxidized more than the substrate 1. Thus, polysilicon has a greater oxide film thickness, the opening is narrowed, and filling properties are degraded. In ozone oxidation, the difference in oxidation rate between polysilicon and silicon is small, and filling properties can be improved without reducing the size of the opening. Ozone oxidation of the substrate 1 may be used to form a film 12 of FIG. 4A and a film 33 of FIG. 4D. The planar orientation dependency in oxidation rate is small, and thus, a uniformly thin film can be formed.

Figure 7C:
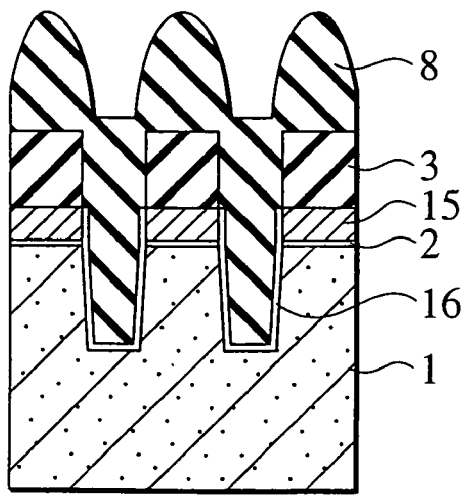

As shown in FIG. 7C, an HDP film 8 is deposited. The film thickness of the oxide film 16 is not large even on the side face of polysilicon 15. Thus, an opening is not narrowed, and the filling properties are not degraded. In the case where ozone oxidation is used, the filling properties are improved even when the silicon oxide film is filled according to an LP-tetra ethyl ortho silicate (TEOS) technique, for example. The optimum improvement in filling that can be produced by ozone oxidation includes the filling properties of the trench 5 of FIG. 4A without polysilicon 15. That is, although filling properties are improved by ozone oxidation, even in a case where ozone oxidation is carried out, when the aspect ratio exceeds about 3, it becomes necessary to use the filling method described in the first to fifth embodiments to fill the HDP film.

In the sixth embodiment, ozone oxidation was carried out for the oxidation of the inside of the trench 5, there is provided a feature that since a difference in oxidation rate between polysilicon 15 and a silicon substrate 1 is small, in the first and second oxidation techniques shown below, an improvement in filling properties similar to that of ozone oxidation can be seen.

The first oxidation technique is directed to a method for combusting hydrogen ($H_2$) and oxygen ($O_2$) immediately above the silicon substrate 1 or the like, followed by combusting and oxidizing the substrate 1.

The second oxidation technique is directed to a method for producing an oxygen radial (O*) by using a catalyst, followed by oxidizing the silicon substrate 1 or the like by using this oxygen radial.

The ozone oxidation and the first and second oxidation techniques are common to each other in that an oxygen radial is generated, and a silicon substrate 1 or the like is oxidized by this oxygen radical. In ozone oxidation, one oxygen atom of the three oxygen atoms (O) configuring ozone is liberated, and an oxygen radial is generated. In combustion and oxidation immediately above an oxide, an oxygen radical with the short service life can be supplied to the substrate 1 or the like, and the oxygen radical is obtained as a primary oxidizer. The oxygen radical has a large oxidation force, and oxidation reaction easily occurs due to this oxidation force, and the oxidation rate is rate.determined to supply the oxygen radical. In this manner, in oxidation due to the oxygen radical, a substantially equal oxidation rate is obtained in a polysilicon 15 and a silicon substrate 1, which can be considered as equal to the supply quantity of oxygen radical.

Figure 7D:
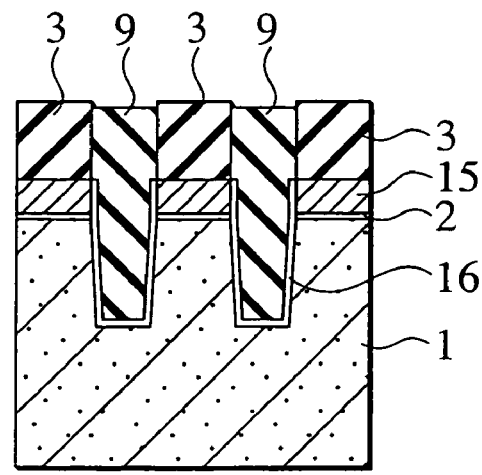
Figure 7E:
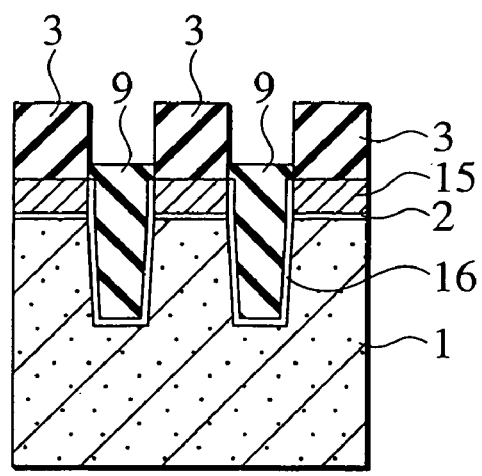
Figure 7F:
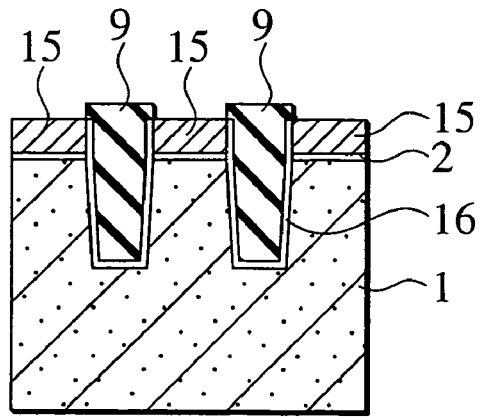

As shown in FIG. 7D, the silicon oxide film 8 is polished according to the CMP technique down to the height of the mask 3. As shown in FIG. 7E and FIG. 7F, the surface of the oxide film 9 is lowered. As shown in FIG. 7E and FIG. 7F, the mask 3 is removed. In doing this, the STI areas 16 and 9 can be formed.

The semiconductor device according to the sixth embodiment, as shown in FIG. 7F, is composed of: a semiconductor substrate 1; an insulating film 2; a polysilicon film 15; a silicon oxide film 16; and an insulator 9. The semiconductor substrate 1 has a trench 5 on the surface. The insulating film 2 is provided so that the back face comes into contact with the surface top of the substrate 1, and has an opening on the trench 5. The polysilicon film 15 is provided on the surface of the insulating film 2, and has an opening on the trench 5. The silicon oxide film 16 has a back face that comes into contact with the bottom face and side face of the trench 5 and that comes into contact with the side face of the opening of the film 15, and the film thickness is uniform. The insulator 9, at the bottom face and side face, comes into contact with the surface of the silicon oxide film 16.

Seventh Embodiment

In the seventh embodiment, as in the third embodiment, the object is to prevent damage to the silicon substrate 1 when the HDP film is deposited. In particular, in a case where the inside of the trench 5 is oxidized before filling the HDP film 7, when the HDP film 7 deposited on the side face is removed, an oxide film 12 formed in the trench 5 is also removed at the same time before filling with the HDP film 8. If a second HDP film 8 is deposited in this state, the silicon substrate 1 is exposed during the second deposition, thus making it possible to prevent damage to the silicon substrate 1 when the HDP film 8 is deposited.

Figure 8A:
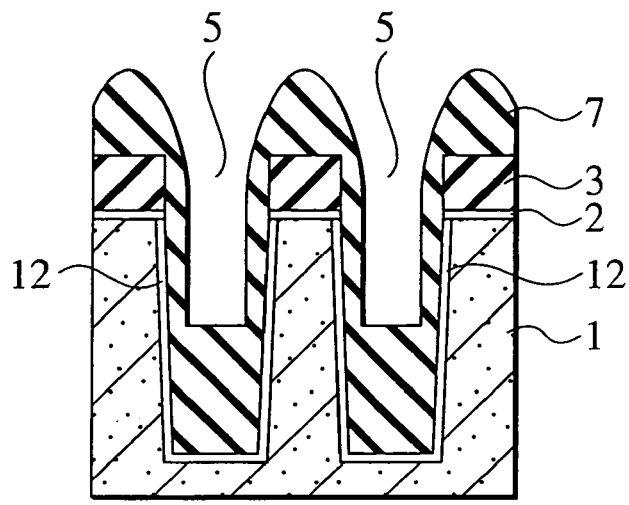
FIG. 8A to FIG. 8F are sectional views showing each stage of a method for manufacturing a semiconductor device of a seventh embodiment.

Therefore, in the case where the inside of the trench 5 is oxidized, after the oxidation process of FIG. 4A in the third embodiment, next, as shown in FIG. 8A, the HDP film 7 is filled into the trench 5 with a high aspect.

Figure 8B:
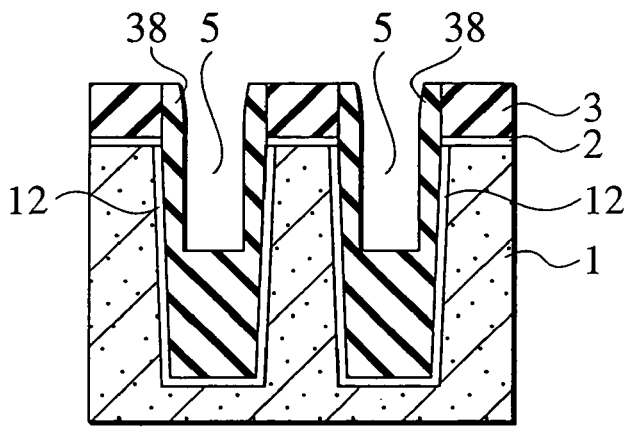

Next, as shown in FIG. 8B, the HDP film 7 formed on the mask 3 is removed according to the CMP technique until the opening of the trench 5 has been exposed. At this time, the HDP film 38 on the side face remains as it is, and thus, the oxide film 12 is not removed.

Figure 8C:
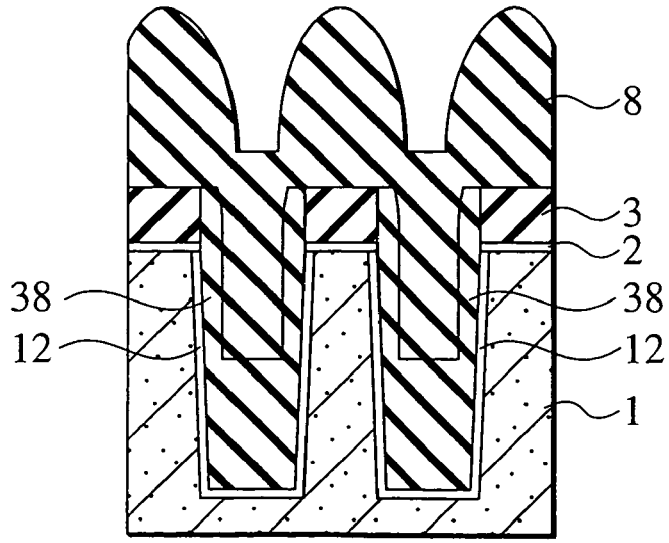

Then, as shown in FIG. 8C, the HDP film 8 is deposited once again. The aspect ratio of the trench 5 is lowered by removing the HDP film 7 on the mask 3 according to the CMP technique. Thus, the HDP film 8 is deposited in this state, thereby making it possible to fill the trench 5 with a high aspect ratio without producing a void. The trench 5 with a high aspect ratio that can not be filled in with the HDP film conventionally can here be filled in with the HDP films 7 and 8.

Figure 8D:
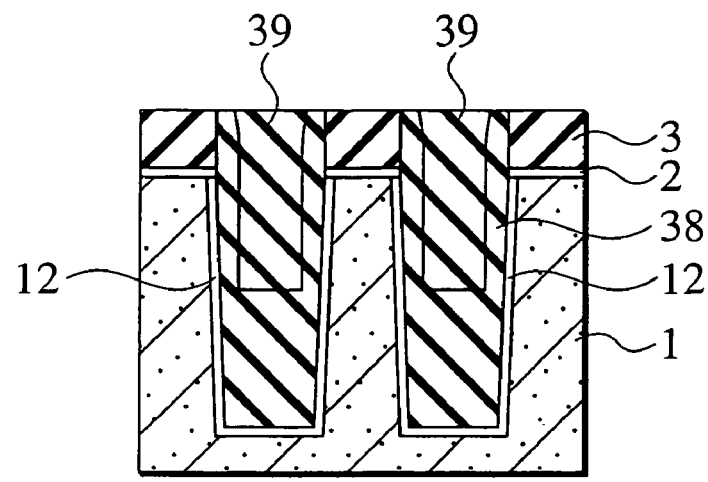

As shown in FIG. 8D, the silicon oxide film 8 is polished according to the CMP technique down to the height of the mask 3. The insulators 38 and 39 are filled in the trench 5.

Figure 8E:
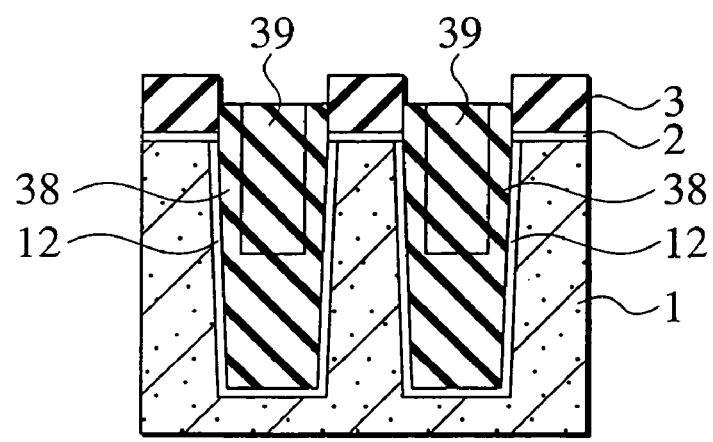
Figure 8F:
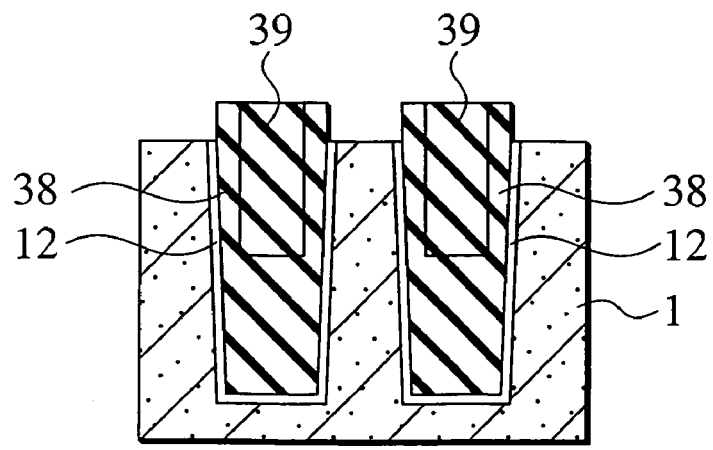

As shown in FIG. 8E, the surface of the oxide films 38 and 39 are each lowered by wet processing such as with a diluted hydrofluoric acid. As shown in FIG. 8F, the mask 3 is removed, and the buffer oxide film 2 is removed. In doing this, the isolation areas 38 and 39 formed by STI area can be produced. In addition, there is no possibility of a damage layer being formed due to the formation of the HDP film 8 in the substrate 1.

The semiconductor device according to the seventh embodiment, as shown in FIG. 8F, has: a semiconductor substrate 1; a silicon oxide film 12; a bottom insulator 38; and an upper insulator 39. The semiconductor substrate 1 has a trench 5 on the surface. The silicon oxide film 12 has a back face that comes into contact with the bottom face and side face of the trench 5. The bottom insulator 38, at the bottom face and side face, comes into contact with the surface of the silicon oxide film 12. The upper insulator 39, at the bottom face and side face, comes into contact with the surface of the bottom insulator 38.

In the case where the trench 5 of the semiconductor substrate 1 exceeds an aspect ratio of about 3, the semiconductor device of the seventh embodiment is more effective. The insulating film 12 laminated on the surface of the trench 5 formed on the surface of the surface of the semiconductor substrate 1 is formed, the bottom insulator 38 is filled into the trench 5, and the upper insulator 39 is filled into the bottom insulator 38, whereby the isolation areas 38 and 39 can be formed.

The HDP film has a hydrofluoric acid etching rate identical to a thermal oxide film even if heat treatment is applied after deposition. In addition, there is an advantage in that a trench with a to some extent high aspect can be filled. This film is optimal for use in STI insulating film. According to the present invention, it is possible to fill with the HDP film a trench with a high aspect ratio that cannot be filled with an HDP film conventionally. Thus, STI area with a high aspect ratio caused by the continuing miniaturization of the semiconductor devices can be manufactured with an HDP film.

Eighth Embodiment

In the eighth embodiment, a method of filling between gate electrodes of a semiconductor device will be described.

The HDP film is filled between gate electrodes forming a trench with a high aspect ratio. First, the HDP film is filled in a trench with the high aspect. Next, the etching of the HDP film deposited in the vicinity of the opening of the trench and depositing the HDP film again are repeated once or a plurality of times. In doing this, a trench with a high aspect that cannot be filled with the HDP film conventionally, here can be filled with the HDP film.

Figure 9A:
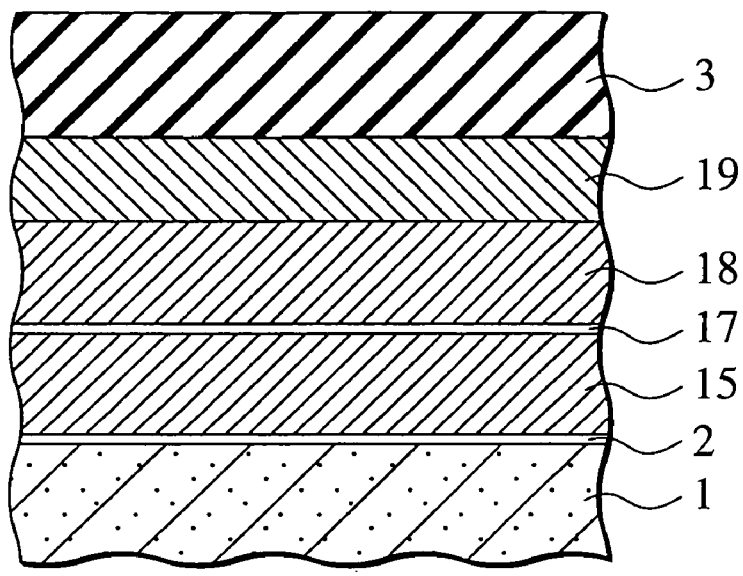
FIG. 9A to FIG. 9P are sectional views showing each stage of a method for manufacturing a semiconductor device of an eighth embodiment for filling between gate electrodes.

(1) First, as shown in FIG. 9A, on a p-type silicon (Si) substrate 1, there are sequentially deposited: an oxide film 2 having a 10 nm tunnel oxide film of nonvolatile memory cells; a polysilicon 15 serving as a floating gate; an oxide nitride oxide (ONO) film 17; a polysilicon film 18 and a tungsten silicide (WSi) film 19 that serve as a control electrode; and a silicon nitride film 3 that serves as a cap.

Figure 9B:
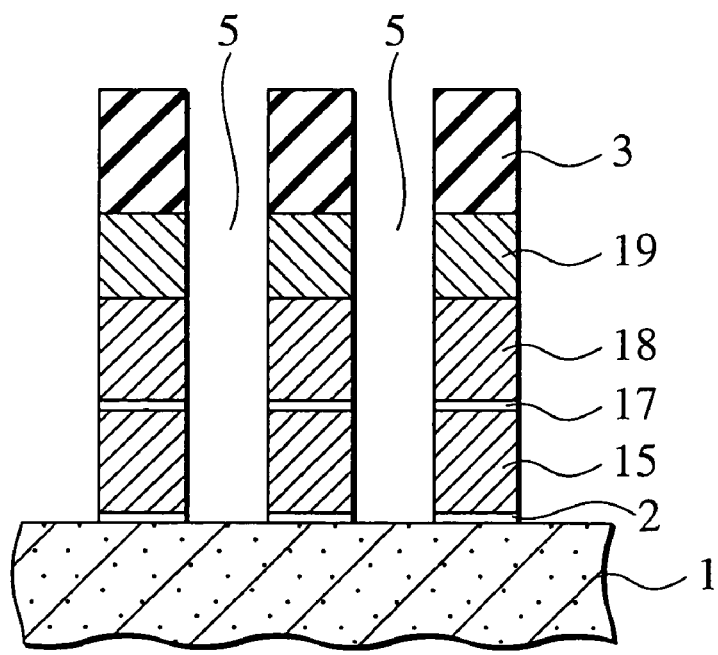

(2) Next, a gate electrode is separated for each element. As shown in FIG. 9B, a trench 5 is formed according to the lithography process and etching. Specifically, the cap material 3, WSi film 19, polysilicon 18, ONO film 17, polysilicon 15, and tunnel oxide film 2 are sequentially etched.

Figure 9C:
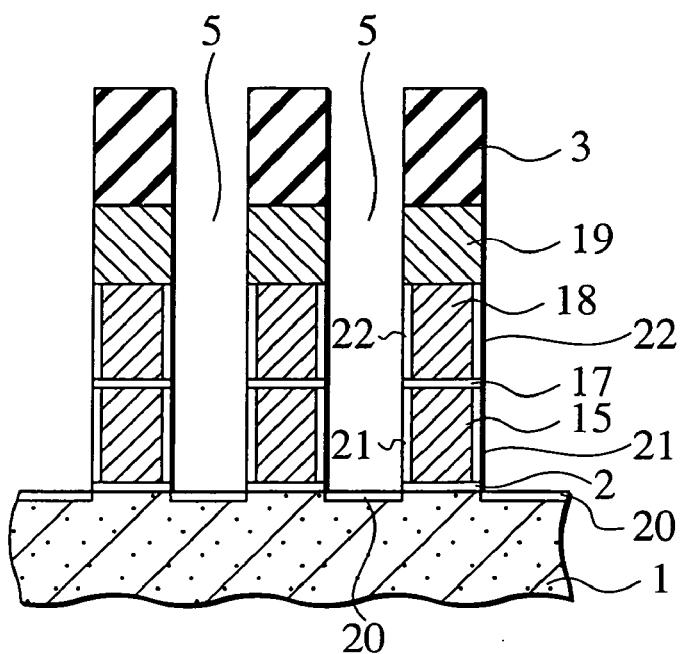

(3) As shown in FIG. 9C, oxide films 20 to 22 are formed according to a thermal oxidation technique, for example. This film thickness is obtained as film thickness of 10 nm, for example.

Figure 9D:
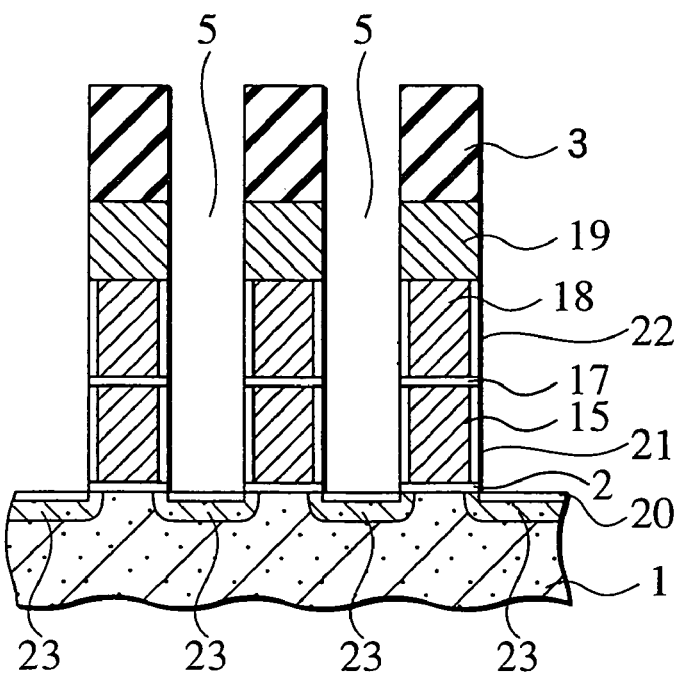

(4) As shown in FIG. 9D, the cap material 3 is defined as a mask while the substrate 1 is subjected to ion implantation, thereby forming an n-type semiconductor area 23.

Figure 9E:
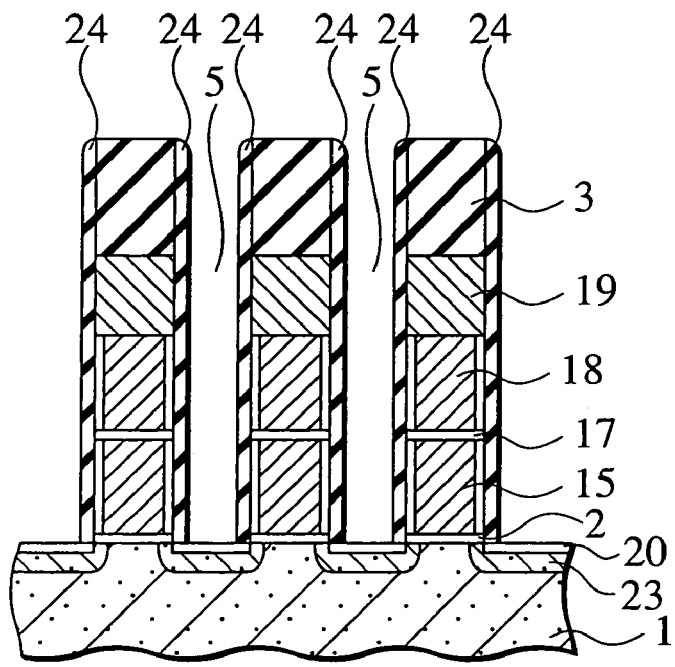

(5) As shown in FIG. 9E, a silicon nitride film is formed at a film thickness of about 20 nm according to the CVD technique, and fully etched back according to a reactive ion etching (RIE) technique, thereby forming a spacer layer 24 of the silicon nitride film.

Figure 9F:
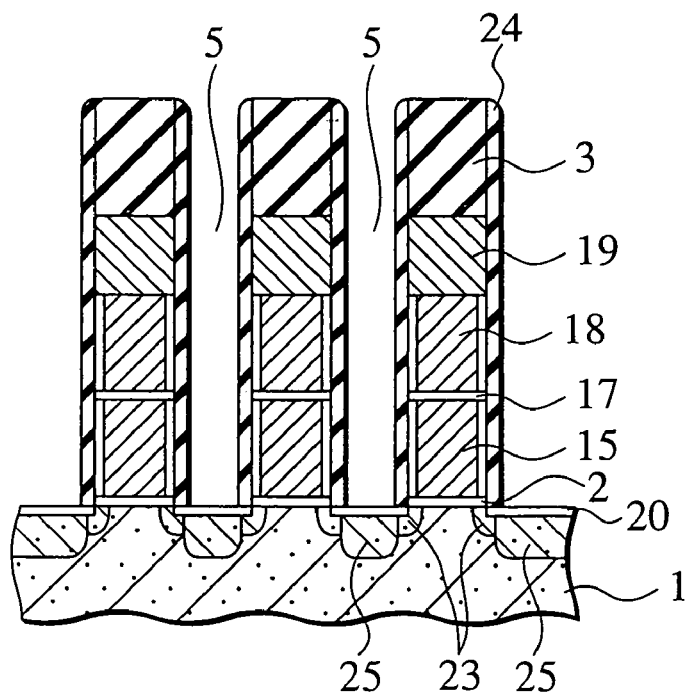

(6) As shown in FIG. 9F, the cap material 3 is defined as a mask while the substrate 1 is subjected to ion implantation, thereby forming an n-type semiconductor area 25. In doing this, semiconductor areas 23 and 25 each serving as a source—drain area can be formed.

Figure 9G:
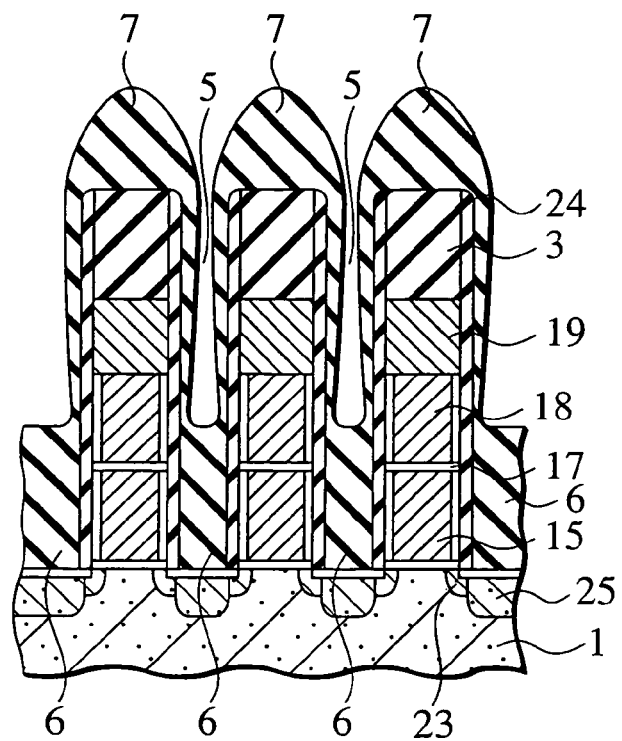

(7) As shown in FIG. 9G, the HDP film 6 is filled in the trench 5. The HDP films 6 and 7 are deposited immediately before the HDP film 7 filled at the upper part of the side face of the trench 5 closes the opening of the trench 5. For example, if an opening width is 60 nm, if the film thickness is deposited by about 200 nm, the depth filled in the HDP film 6 is also obtained at about 200 nm. Then, the film thickness of the side face part of the HDP film 7 is about 20 nm which is about $1/10$ thereof If a film 7 of 20 nm is deposited on the side faces of both sides of the trench 5 with an opening width of 60 nm, the remaining opening is 10 nm.

Figure 9H:
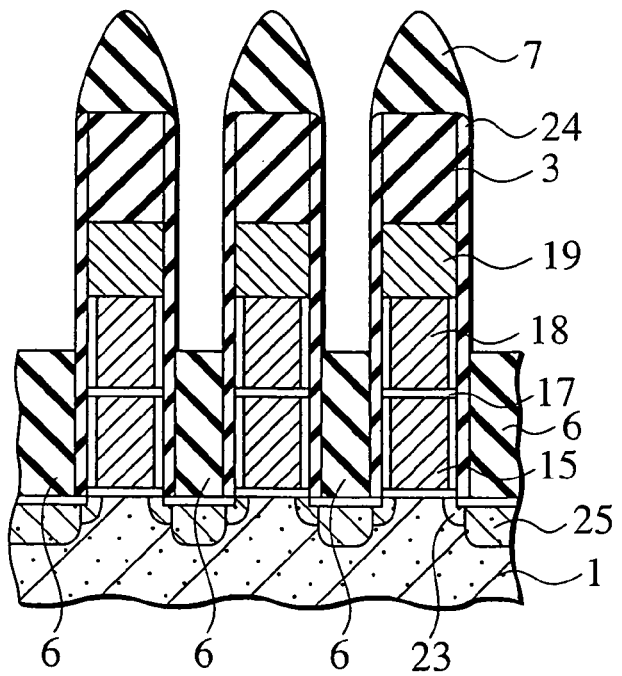

(8) As shown in FIG. 9H, the HDP film 7 deposited on the side faces is removed by etching, by using wet etching processing such as diluted hydrofluoric acid, CDE, or alternatively, a hydrogen fluoride vapor phase cleaning (VPC) technique and the like. At the same time, the full surface of the HDP films 6 and 7 are each etched in an isotropic manner, and the top face of the film 6 is also retracted to some extent. For example, when the film 7 on the side faces of 20 nm in film thickness is removed, the upper part of the film 6 is also removed by a depth of about 20 nm. However, this removal is merely 10% of the original depth of 200 nm, and a depth of 180 nm is left as it is.

Figure 9I:
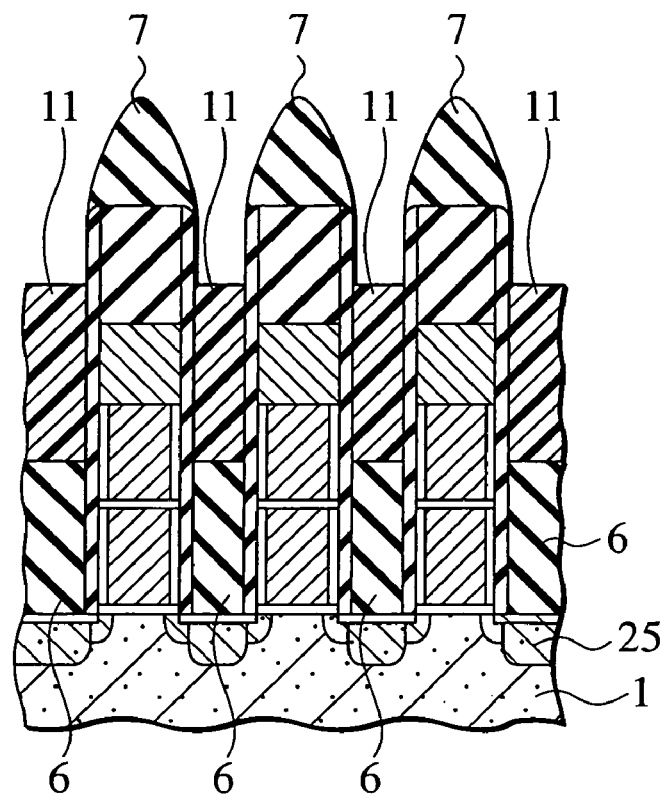

(9) Next, a photo resist is fully applied, and a resist 10 is fully etched back according to the CDE technique. As shown in FIG. 9I, a resist 11 remains only in the trench 5.

Figure 9J:
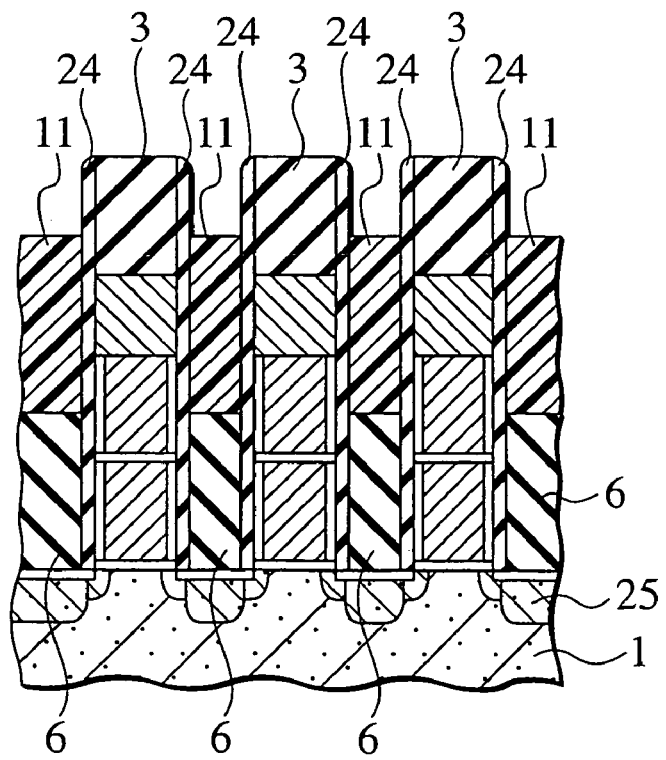

(10) As shown in FIG. 9J, only the HDP film 7 on the mask 3 is selectively removed according to wet etching processing such as diluted hydrofluoric acid.

Figure 9K:
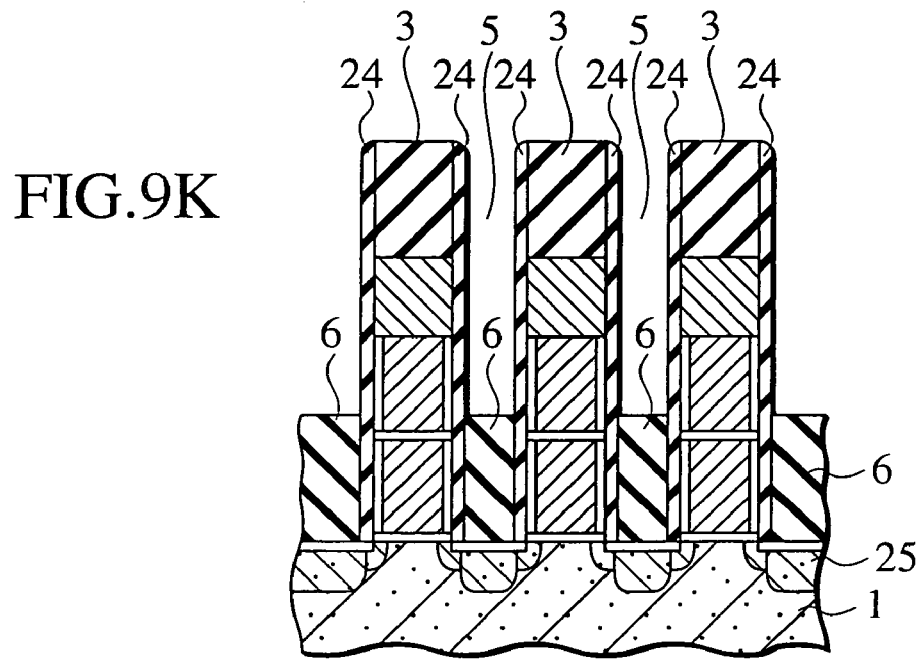

(11) As shown in FIG. 9K, the photo resist 11 in the trench 5 is selectively removed according to the CDE technique.

Figure 9L:
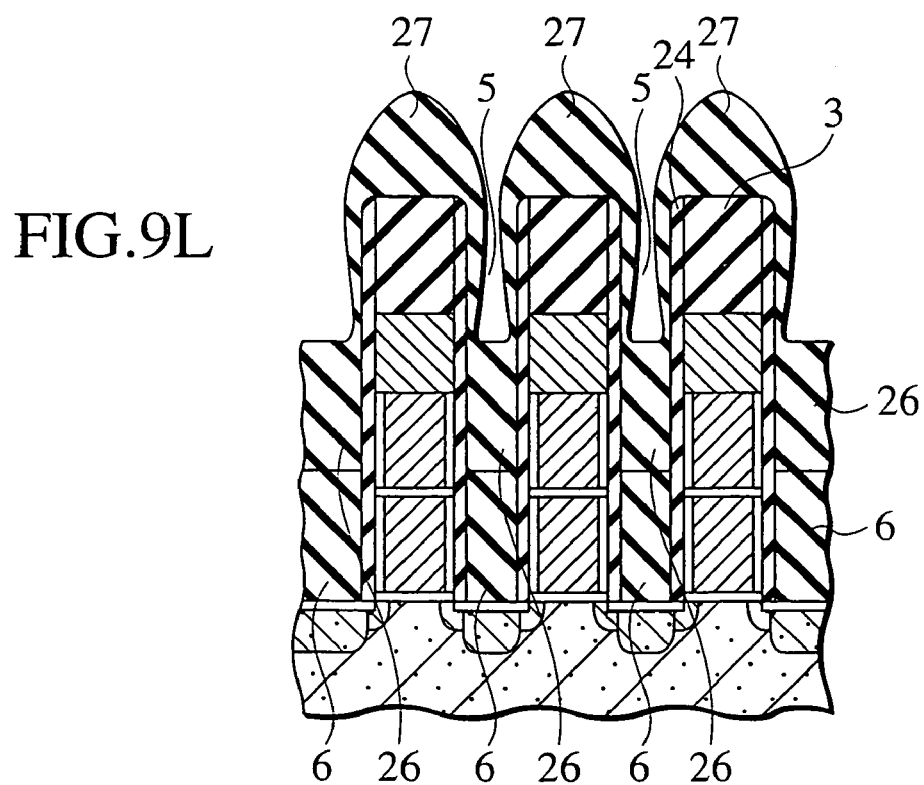

(12) As shown in FIG. 9L, an HDP film 26 is further deposited. Deposition of the HDP film 26 can be carried out as with the film 6. That is, the opening width is 60 nm the same as during deposition, and thus, a film thickness of about 200 nm can be deposited, and the depth that can be filled in the HDP film 26 is also obtained at about 200 nm. The film thickness of the side face part of the HDP film 27 is also obtained as about 20 nm, and thus, an opening is also left of about 10 nm. The total filling depth when the films 6 and 26 are added to each other reaches 380 nm.

Figure 9M:
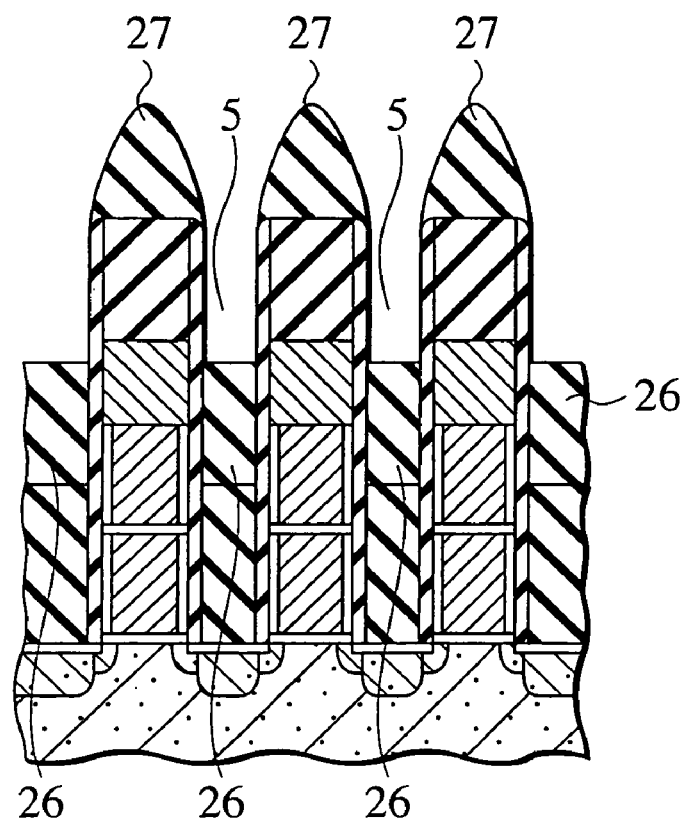

(13) As shown in FIG. 9M, the HDP film 27 deposited on the side face is removed by etching using wet etching processing such as a diluted hydrofluoric acid. At the same time, the full surface of the HDP films 26 and 27 are each etched in an isotropic manner, and the top face of the film 6 is also retracted to some extent. If the film 27 on the side faces of 20 nm in film thickness is removed, the upper part of the film 26 is also removed by a depth of about 20 nm. However, this removal is merely 10% of the original depth of 200 nm, and a depth of 180 nm is left, and the total of depths when the films 6 and 26 are added together is 360 nm.

Figure 9N:
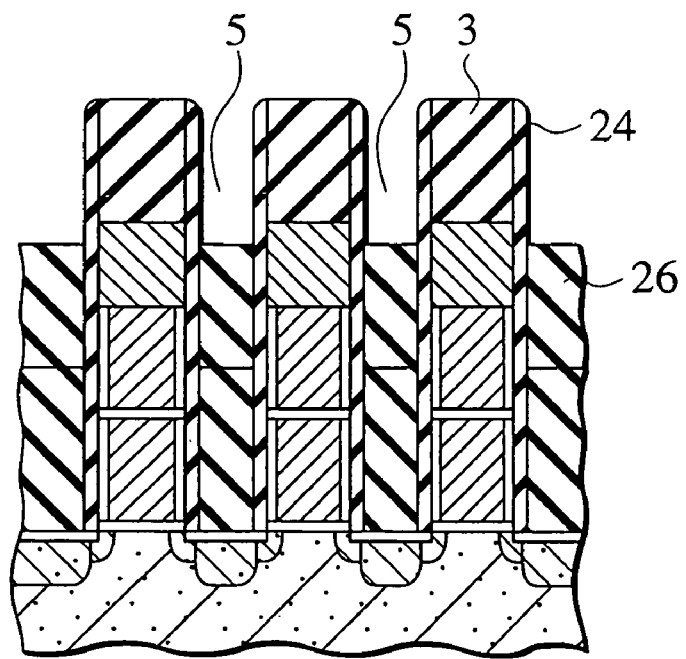

(14) Next, the stages (9) to (11) are executed again, and only the HDP film 27 on the mask 3 is removed as shown in FIG. 9N.

Figure 9O:
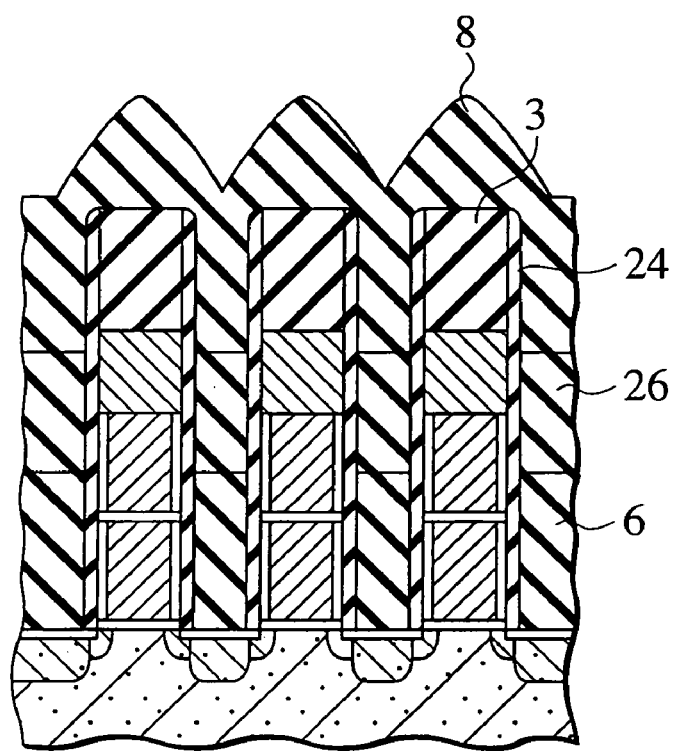

(15) As shown in FIG. 9O, the HDP film 8 is further deposited. In deposition of the HDP film 8, the remaining depth of the trench 5 left unfilled is 160 nm, the opening width is 60 nm, and the aspect ratio is 3 or less. Thus, the trench 5 can be completely filled by the deposition of the HDP film 8.

(16) Lastly, as shown in FIG. 9F, the silicon oxide film 8 is polished according to the CMP technique down to the height of the mask 3.

Figure 9P:
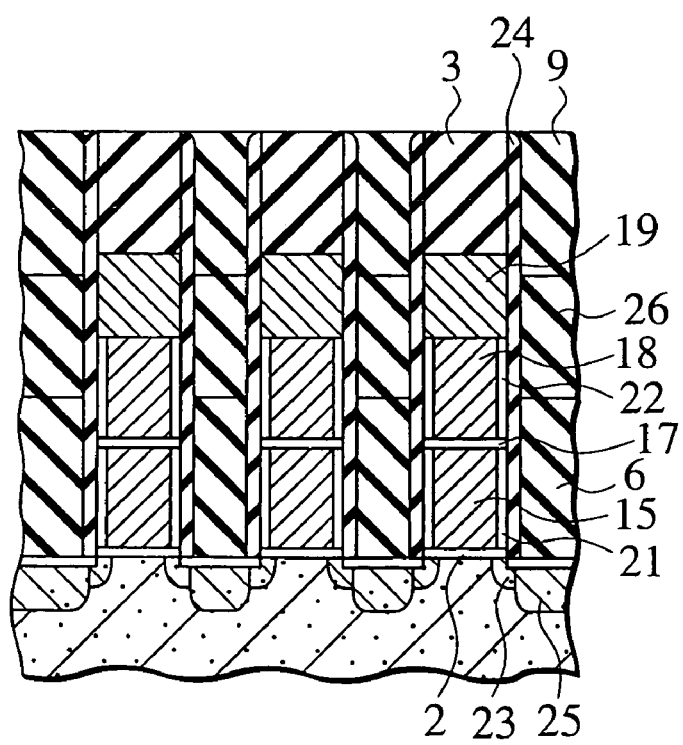

As shown in FIG. 9P, the semiconductor device according to the eighth embodiment is a semiconductor device having the nonvolatile memory cell. The nonvolatile memory cell is composed of: a semiconductor substrate 1; a plurality of gate electrodes; insulating films 6, 26, and 9. The gate electrode is provided at the upper part of the substrate 1. The insulating films 6, 26, and 9, at their side faces, come into contact with the side faces of a plurality of gate electrodes, and are composed of insulating films 6, 26, and 9 laminated on the substrate 1, respectively.

Semiconductor areas 23 and 25, of a different electrical conduction type from the substrate 1 serving as a source— drain area, exist at the upper part of the substrate 1. The gate electrode is composed of an oxide film 2 of 10 nm in film thickness serving as a tunnel oxide film of the nonvolatile memory cell on the substrate 1; polysilicon film 15 of 125 nm in film thickness serving as a part of the floating gate on the film 2; an insulating film 17 such as an ONO film of 10 nm in film thickness on such polysilicon film 15; polysilicon film 22 of 125 nm in film thickness serving as a control electrode on the film 17; a WSi film 19 of 100 nm in film thickness; a silicon nitride film 3 of 150 nm in film thickness that serves as a cap on the film 19; and a silicon nitride film 24 of 20 nm in film thickness that serves as a spacer provided on a side face thereof. The pitch of the gate electrode is 200 nm, and the line and spaces are 100 nm and 100 nm. In a trench having the semiconductor substrate 1 defined as a bottom face and having the side faces of a plurality of gate electrodes defined as a side face, the opening width is 60 nm, the depth is 520 nm, and the aspect ratio exceeds 3 and reaches 8. The eighth embodiment can be applied to an electric field effect transistor (FET) or the like without being limited to a nonvolatile memory cell.

Ninth Embodiment

In the ninth embodiment, a method for filling between metal interconnections of a semiconductor device will be described here. In a method for manufacturing a semiconductor device according to the ninth embodiment, an HDP film is filled between metal interconnections forming a trench with the high aspect ratio.

Figure 10A:
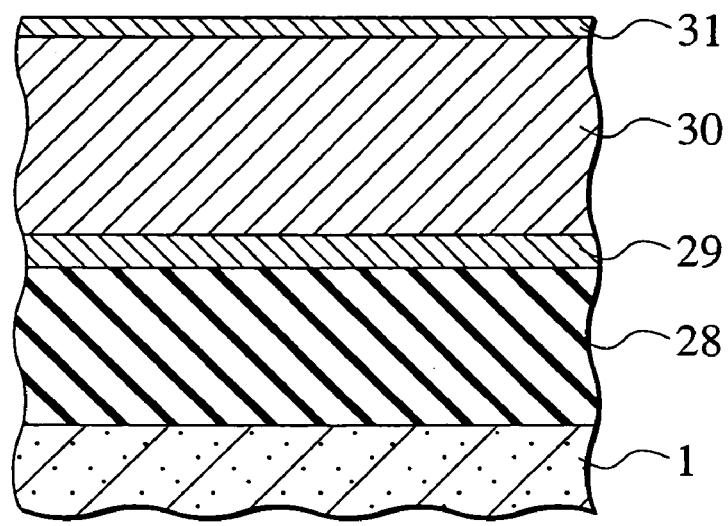
FIG. 10A to FIG. 10I are sectional views showing each stage of a method for manufacturing a semiconductor device of a ninth embodiment for filling between interconections.

(1) First, as shown in FIG. 10A, an inter-layer insulating film 28, a titanium nitride (TiN) film 29, an aluminum (Al) alloy film 30, and a titanium nitride film 31 are sequentially deposited on a silicon substrate 1.

Figure 10B:
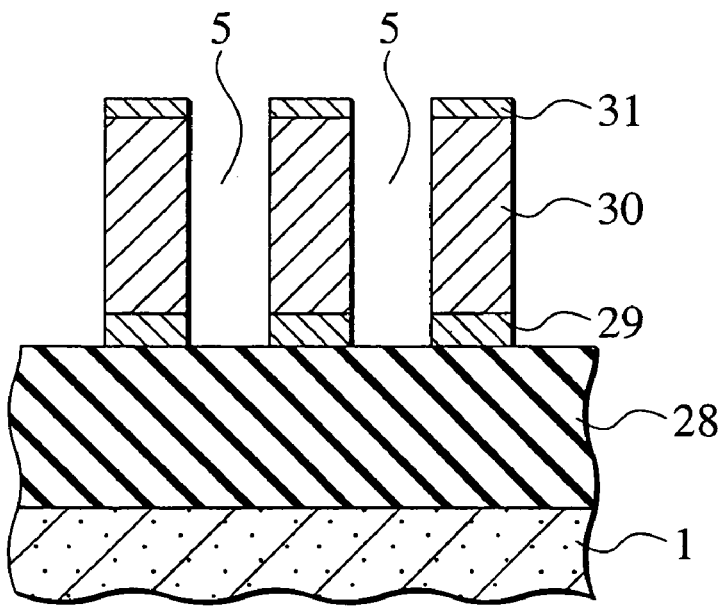

(2) Next, as shown in FIG. 10B, a trench 5 is dug according to a lithography process and etching. Specifically, the titanium nitride film 31, aluminum alloy film 30, and titanium nitride film 29 are sequentially etched. Then, the etched films separate each interconnection.

Figure 10C:
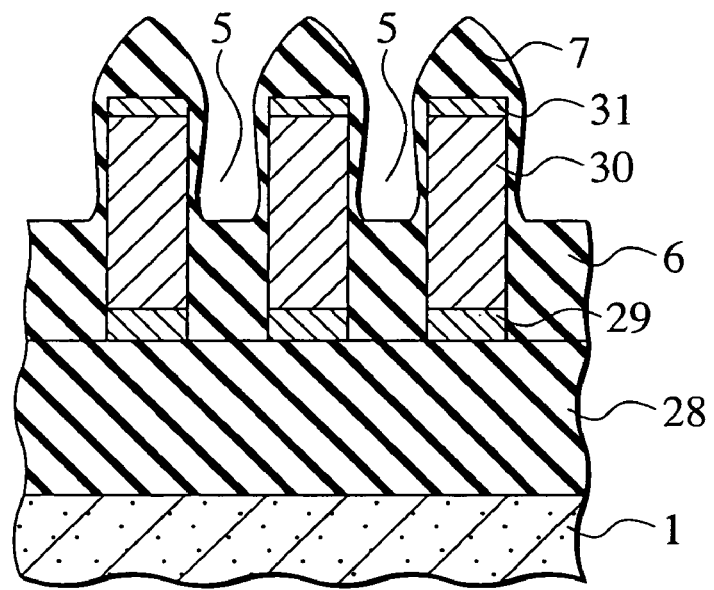
Figure 10D:
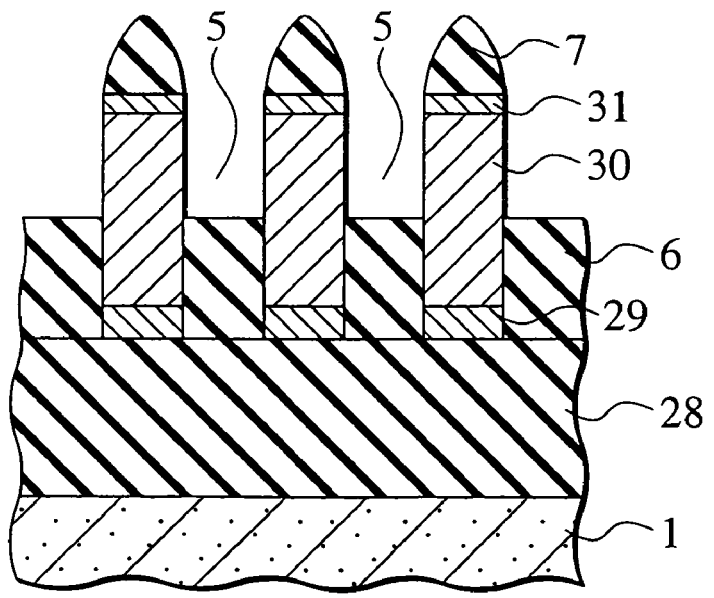

(3) As shown in FIG. 10C, an HDP film 6 is filled in this trench 5. The temperature of the substrate 1 during filling is set to about 450° C. The temperature is reduced to be lower than 650° C. according to the first and second embodiments, although the filling properties are degraded. This is because the upper limit of the heat resistance temperature of an aluminum alloy film 30 is about 450° C. The degree of degradation of filling properties is lowered from about 3 of 650° C. to about 2 of 650° C. for aspect ratios at which filling is possible. The HDP films 6 and 7 are deposited immediately before the HDP film 7 deposited at the upper part of the side face of the trench 5 closes the opening of the trench 5. With an opening width is 100 nm, if the film is deposited at a film thickness of about 150 nm, the depth filled in the HDP film 6 is also defined as about 150 nm, and the film thickness of the side face part of the HDP film 7 is about 30 nm which is about ⅕ thereof. When the film 7 of 30 nm is deposited on the side face on both sides of a trench 5 of 100 nm in opening width, the remaining opening is 40 nm (4) As shown in FIG. 10D, the HDP film 7 deposited on the side faces is removed by etching using the CDE technique. At the same time, the full surfaces of the HDP films 6 and 7 are each etched in an isotropic manner, and the upper face of the film 6 is also retracted to some extent. For example, if the film 7 at the side faces part of 30 nm in film thickness is removed, the upper part of the film 6 is also removed by a depth of about 30 nm. However, this removal is merely 20% of the original depth of 150 nm, and a depth of 120 nm remains.

Figure 10E:
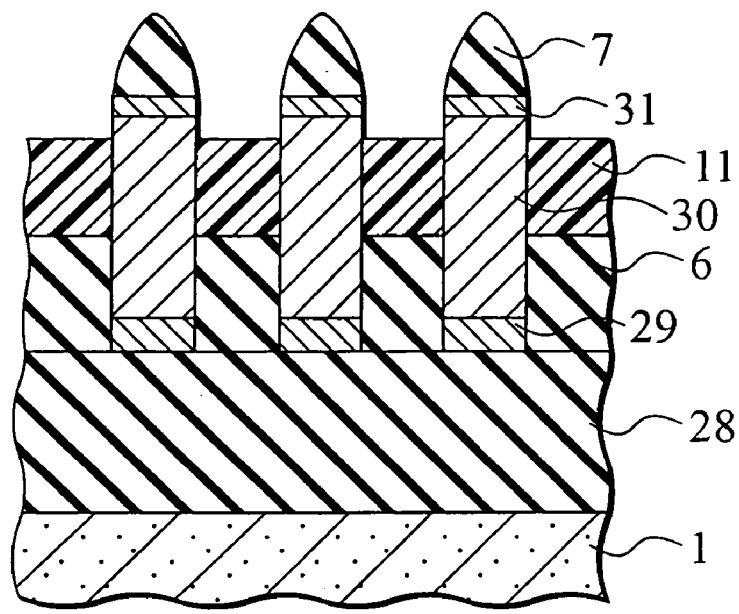

(5) Next, a photo resist is fully applied, the resist is fully etched back according to the CDE technique, and the resist 11 is filled in the trench 5, as shown in FIG. 10E.

Figure 10F:
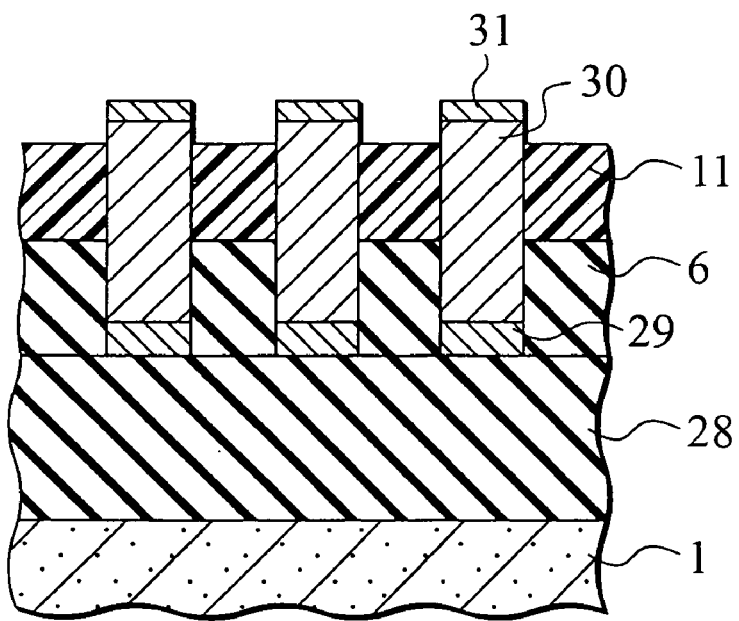
Figure 10G:
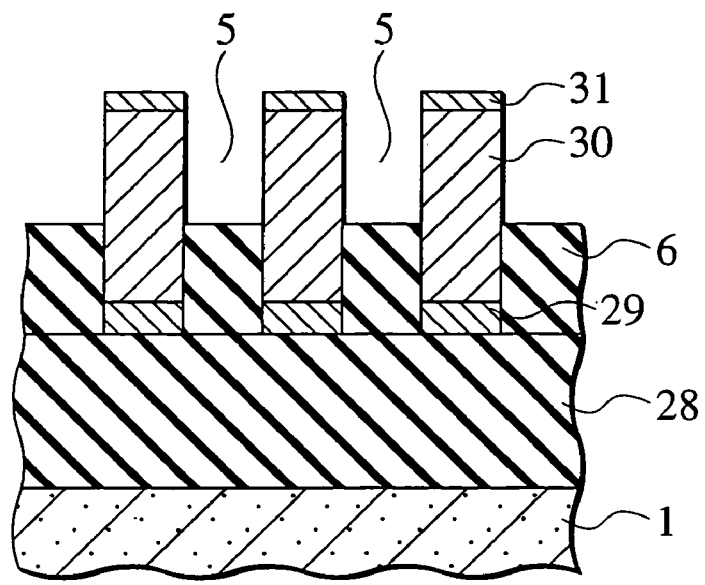

(6) As shown in FIG. 10F, with the resist 11 is defined as a mask, the CDE technique is carried out, and only the HDP film 7 on the interconnection 31 is removed.

(7) As shown in FIG. 10C, the photo resist 11 in the trench 5 is selectively removed according to the CDE technique.

Figure 10H:
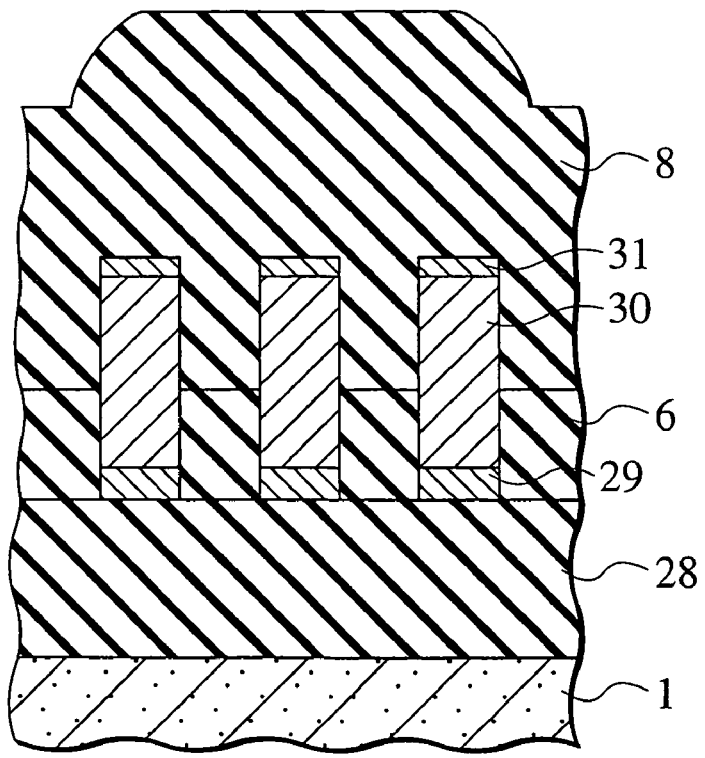

(8) The HDP film 8 is further deposited as shown in FIG. 10H. In deposition of the HDP film 8, the remaining depth of the trench 5 free of being filled is 180 nm, the opening width is 100 nm, and the aspect ratio is 2 or less. Thus, the trench 5 can be completely filled in by deposition of the HDP film 8.

Figure 10I:
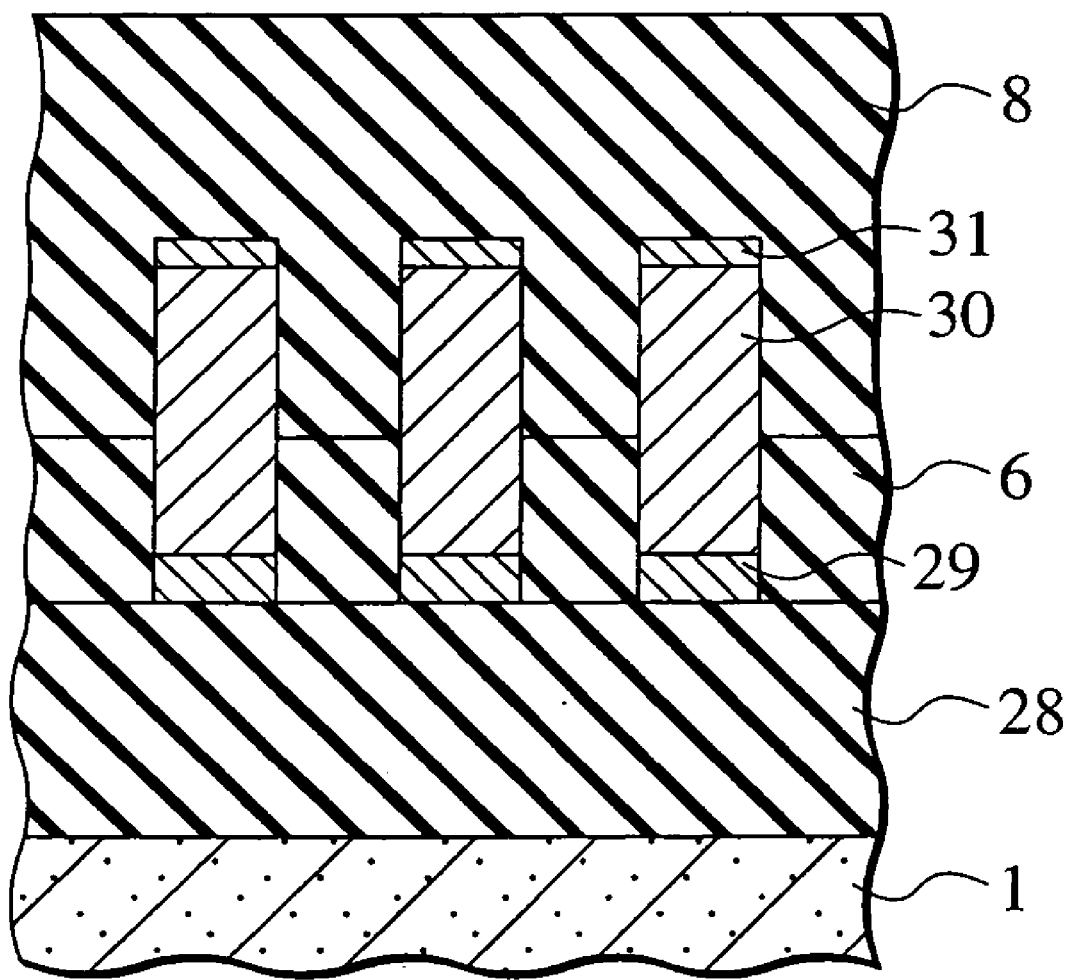

(9) Lastly, as shown in FIG. 10I, the silicon oxide film 8 is flattened according to the CMP technique.

As shown in FIG. 10I, the semiconductor device according to the ninth embodiment is composed of: an inter-layer insulating film 28; a plurality of metal interconnections 29 to 31; an insulating film 6; and an insulating film 8. The inter-layered insulating film 28 is provided on the semiconductor substrate 1. A plurality of metal interconnections 29 to 31 are provided on the film 28. An insulating film 6, at the wide face, comes into contact with the lower side faces of a plurality of metal interconnections 29 to 31, and is laminated on the film 28. The insulating film 8 comes into contact with an upper side face of a plurality of metal interconnections 29 to 31, and is provided on the film 6 and metal interconnections 29 to 31.

The metal interconnections 29 to 31 are composed of a titanium nitride film 29 of 40 nm in film thickness on the film 28; an aluminum alloy film 30 of 240 nm in film thickness on the film 29; and a titanium nitride film 31 of 20 nm in film thickness on the film 30. The pitch between the metal interconnections 29 to 30 is 20 nm, and the line and space is 100 nm and 100 nm. A trench having the film 28 defined as a bottom face and having side faces of a plurality of interconnections 29 to 31 defined as a side face is 100 nm in opening width, 300 nm in depth, and 3 in aspect ratio.

Tenth Embodiment

The tenth embodiment describes a semiconductor device manufacturing method capable of manufacturing an isolation area for a high voltage resistance circuit in a peripheral circuit area, in the process of manufacturing a STI area of a low voltage resistance circuit in an internal circuit area.

A case of forming a gate electrode and an isolation area in a self alignment manner will be described here. Before forming STI area, ion implantation for forming a well is carried out. At this time, a portion free of ion implantation is masked with a photo resist in order to limit the ion implantation area. Thus, before ion implantation for forming a well, it is necessary to form a mark for carrying out photolithography alignment. When such a mark is formed, deep STI area can be formed at the portion of an isolation area requiring STI area having the high isolation resistance.

The gate element and isolation area for the low voltage resistance circuit and high voltage resistance circuit are formed in a self alignment manner. At this time, a method for forming STI area with the high isolation resistance of the high voltage resistance circuit includes: forming a deep, narrow trench at a portion of the isolation area requiring deep STI area and filling with an insulating film. Next, the mask and gate insulating film in this isolation area are removed, and the insulating film filled in a deep, narrow trench is etched back. Then, a shallow, wide trench is formed in this isolation area, and an insulating film is filled in. In this manner, deep SIT can be formed at a portion requiring isolation resistance.

First, as shown in FIG. 11A, on the semiconductor substrate 1, a silicon oxide film is formed as a buffer insulating film 2 according to a thermal oxidation technique. Next, as a mask 3, for example, a silicon nitride film is deposited according to a thermal CVD technique.

Then, as shown in FIG. 11B, in the high voltage resistance circuit area, an opening 41 of a photo resist 4 is formed in a pattern shape of an area for forming deep STI area according to a photolithography technique. In addition, in a mask alignment mark area, an opening 42 having the mark pattern shape is also formed with the photo resist 4 at the same time. In an internal low voltage resistance circuit area, the photo resist 4 is fully formed on the mask 3, and an opening is not formed in the resist 4.

Next, as shown in FIG. 11C, with the photo resist 4 is defined as a mask, a buffer insulating film 2 is etched in a RIE technique. The opening 42, having the pattern shape of an alignment mark, and the opening 41, having the pattern shape of an area for forming STI area, are formed on the mask 3. On the other hand, in the low voltage resistance circuit area, the mask 3 is not etched during this etching.

Figure 11D:
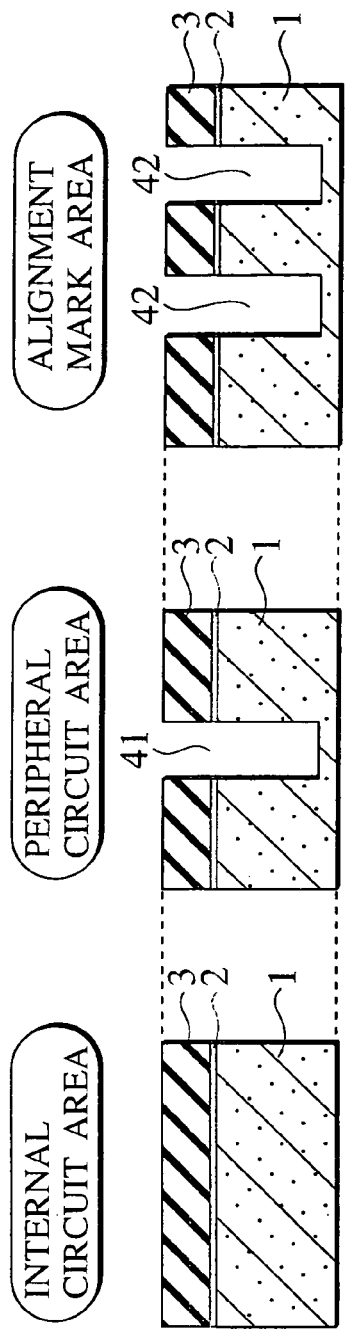

Further, as shown in FIG. 11D, the semiconductor substrate 1 and insulating film 2 are etched, and a trench 41 of a deep STI area is formed. At the same time, mark sections silicon substrate 1 and insulating film 2 are etched, and a trench 42 being a mark is formed. The depth from the surface to the bottom of the substrate 1 of the trench 41 and trench 42 is 0.6 microns. In addition, the width between the trench 41 and trench 42 is 2 microns. On the other hand, the low voltage resistance circuit area is masked by the mask 3 during this etching, and the silicon substrate 1 and insulating film 2 are not etched.

Figure 11E:
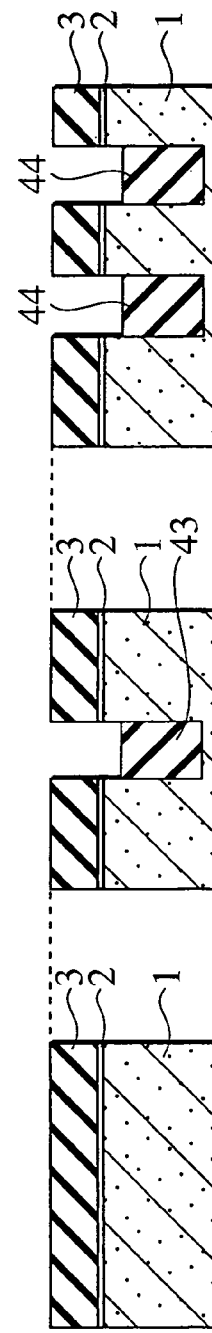

Then, as shown in FIG. 11E, the isolation insulating films 43 and 44 (for example, an HDP film) are filled in this trench 41 and trench 44. Further, the insulating films 43 and 44 are polished down to the height of the mask 3 according to the CMP technique. Then, the surface of the oxide films 43 and 44 are each lowered from the surface of the mask 3 according to an etching process using diluted hydrofluoric acid (HF). On the other hand, the low voltage resistance circuit area is protected by the mask 3 during the filling and polishing of these, and the silicon substrate 1 and insulating film 2 are not polished or etched.

Figure 11F:
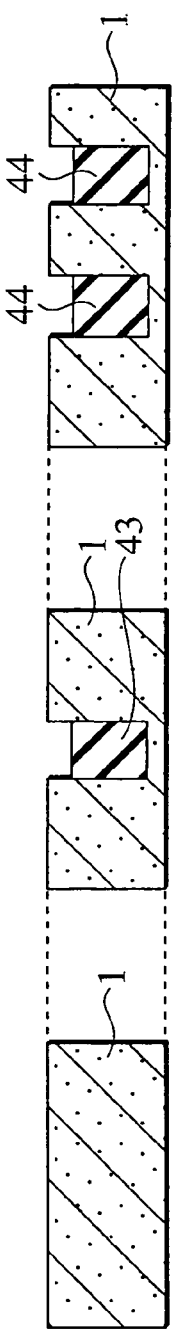

Then, as shown in FIG. 11F, the mask 3 and buffer oxide film 2 are removed.

Then, ion implantation for forming a well is carried out. First, in a photolithography technique, a pattern of a photo resist 45 limiting an area for ion implantation is formed, as shown in FIG. 11G. The pattern of the photo resist 45 is disposed so as to align a mark 42 formed on the semiconductor substrate 1 and a mark formed on the resist 45. Next, ion implantation of impurities is carried out. An ion beam 46 is emitted.

Then, as shown in FIG. 11H, a gate insulating film 47 is formed on the semiconductor substrate 1 according to thermal oxidation. Then, on the insulating film 47, a polysilicon film is deposited as a gate electrode material 48. Then, on the polysilicon film 48, for example, a nitride silicon film is deposited as mask 49.

As shown in FIG. 11I, openings 51 and 52 in the pattern shape of STI area of a photo resist 50 is formed according to the photolithography technique. The patterns of the openings 51 and 52 of the photo resist are disposed so as to align an oxide film 44 being a mark with a mark 53 formed on the resist 50.

Next, as shown in FIG. 11J, with the photo resist 50 is defined as a mask, the mask 49 and gate electrode material 48 are etched according to the RIE technique. The openings 51 and 52 having the pattern shape of an area for forming STI area are formed on the mask 49 and gate electrode material 48.

As shown in FIG. 11K, a gate insulating film 47 to be exposed is etched. Further, insulating films 43 and 44 filled in deep trenches 41 and 53 are etched back to some extent.

Then, as shown in FIG. 11L, the semiconductor substrate 1 is etched, and trenches 51 and 52 being isolation areas are formed. At this time, in a mark area, the silicon substrate 1 is hardly etched. The depth from the surface to bottom of the substrate 1 of the trenches 51 and 52 is 0.3 micron. In addition, the width of the trench 52 is between 4 microns and 8 microns. As this width increases, large voltage resistance between elements can be produced. Even at a width of about 4 microns, a voltage resistance of 20V or more is produced.

Figure 11M:
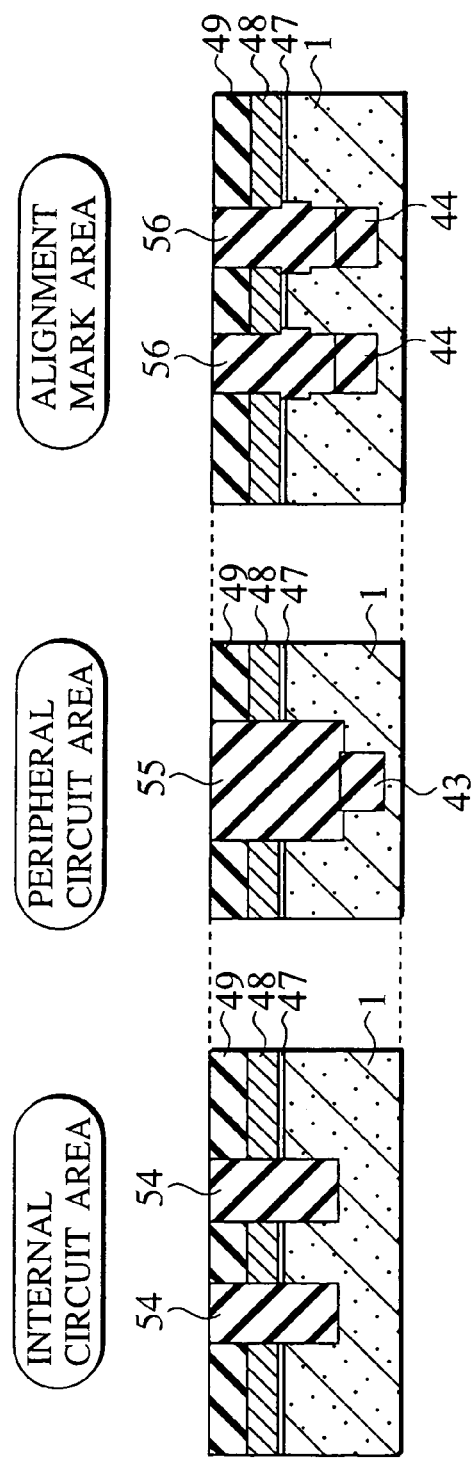

Then, as shown in FIG. 11M, these trenches 51 and 52 and the isolation insulating films 54, 55, and 56 (for example, an HDP film) are filled in an opening 53 serving as a mark. In this way, deep STI area 43 and 55 is formed in the high voltage resistance circuit area requiring high isolation resistance. In addition, there is formed an isolation area using shallow STI area 54 which is advantageous in filling an STI insulating film. In a mark area, the opening 53 as well is filled with an insulating film 56.

In the case where a gate electrode and an isolation area are thus formed in a self alignment manner, ion implantation for forming a well is required before forming STI area. Thus, in the case where the gate electrode and isolation area are formed in a self alignment manner, it is necessary to form a mark for carrying out photography alignment before ion implantation for forming a well. At the same time when such a mark is formed, a deep trench can be formed at a portion requiring STI area that has the high isolation resistance. Thus, deep STI area and shallow STI area can be produced separately with a slight increase in stages.

As shown in FIG. 11M, a semiconductor device according to a tenth embodiment has a specific structure for each area.

First, the semiconductor device according to the tenth embodiment has a semiconductor substrate 1, a silicon oxide film 47, a polysilicon film 48, a silicon nitride film 49, and an upper insulator 54 on the internal low voltage resistance circuit area. The silicon oxide film 47 is provided on the semiconductor substrate 1, and is obtained as a gate insulating film 47. The polysilicon film 48 is provided on the silicon oxide film 47, and serves as a gate electrode 48. A silicon nitride film 49 is provided on the polysilicon film 48, and serves as a mask 49. An insulating material 54 penetrates the silicon nitride film 49, the polysilicon film 48, and the silicon oxide film 47, reaches the inside of the substrate 1, and is disposed so as to surround the surface of the substrate 1. This upper insulator 54 comes into contact with the substrate 1 on the bottom face, and comes into contact with the substrate 1 and films 47, 48, and 49 when the side face is defined as a plane. The upper face of the upper insulator 54 is provided on the same plane as the upper face of the film 49.

Next, the semiconductor device according to the tenth embodiment has a semiconductor substrate 1, a silicon oxide film 47, a polysilicon film 48, a silicon nitride film 49, an upper insulator 55, and a bottom insulator 43 on the peripheral high voltage resistance circuit area. The silicon oxide film 47 is provided on the semiconductor substrate 1, and serves as a gate insulating film 47. The polysilicon film 48 is provided on the silicon oxide film 47, and serves as a gate electrode 48. The silicon nitride film 49 is provided n the polysilicon film 48, and serves as a mask 49. The upper insulator 55 penetrates the silicon nitride film 49, the polysilicon film 48, and the silicon oxide film 47, reaches the inside of the substrate 1, and is disposed so as to surround the surface of this substrate 1. The bottom insulator 43 is filled in the substrate in contact with the lower part of this upper insulator 55. The upper insulator 55, on the bottom face, comes into contact with the substrate 1 and the bottom insulator 43, and the upper insulator 55, on the side face comes into contact with the substrate 1 and the bottom insulator 43 on the plane. The upper face of the upper insulator 55 is provided on the same plane as that of the film 49. The width of the upper insulator 55 is wider than that of the upper insulator 54. A depth from the surface of the substrate 1 on the bottom face of the bottom insulator 43 is deeper than the bottom face of the upper insulator 54. The bottom insulator 43, on the bottom face and side face, comes into contact with the substrate 1, and the bottom insulator 43, on the upper face, comes into contact with the insulator 55.

Lastly, the semiconductor device according to the tenth embodiment has a semiconductor substrate 1, a silicon oxide film 47, a polysilicon film 48, a silicon nitride film 49, an upper insulator 56, and an insulating film 44 on the mask alignment mark area. The silicon oxide film 47 is provided on the semiconductor substrate 1, and serves as a gate insulating film 47. The polysilicon film 48 is provided on the silicon oxide film 47, and serves as a gate electrode 48. The silicon nitride film 49 is provided on the polysilicon film 48, and serves as a mask 49. The upper insulator 56 penetrates the silicon nitride film 49, the polysilicon film 48, and the silicon oxide film 47, reaches the inside of the substrate 1, and is disposed so as to surround the surface of the substrate 1. The insulating film 44 is filled in the substrate 1 in contact with the lower part of this upper insulator 56. The upper insulator 56, on the bottom face, comes into contact with the insulating film 44, and the upper insulator 56, on the side face, comes into contact with the substrate 1 and the films 47, 48, and 49. The upper face of the upper insulator 56 is provided on the same plane as that of the film 49.

Eleventh Embodiment

The eleventh embodiment can be applied in a method for manufacturing a nonvolatile memory cell. In addition, the eleventh embodiment can be applied in an electric field effect transistor (FET) or the like.

Figure 12A:
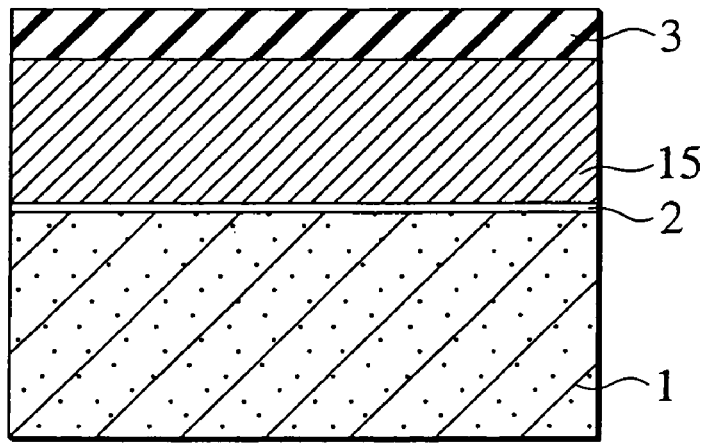
FIG. 12A to FIG. 12H are sectional views showing each stage of a method for manufacturing a semiconductor device of an eleventh embodiment.

First, as shown in FIG. 12A, on the silicon substrate 1, there are sequentially deposited: an oxide film 2 of 10 nm in film thickness serving as a tunnel oxide film of a nonvolatile memory cell; a polysilicon 15 serving as a part of a floating gate; and a silicon nitride film that functions as a cap material 3.

Figure 12B:
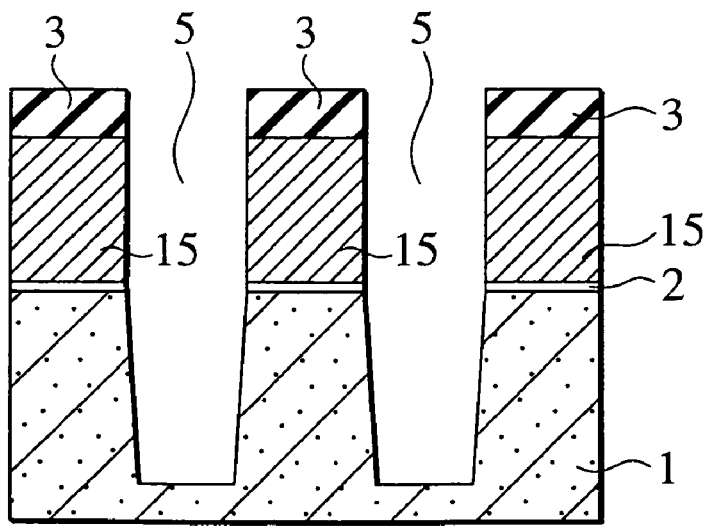

Next, as shown in FIG. 12B, the trench 5 is formed in an area serving as an isolation area according to a lithography process and etching. Specifically, the cap material 3, gate material 15, silicon oxide film 2, and substrate 1 are sequentially etched. The isolation trench 5 and the films 3 and 15 are formed in a self alignment manner. In this manner, an aspect ratio of the trench 5 increases. A depth of the isolation trench 5 dug in the substrate 1 is obtained as a depth of 300 nm, for example.

Figure 12C:
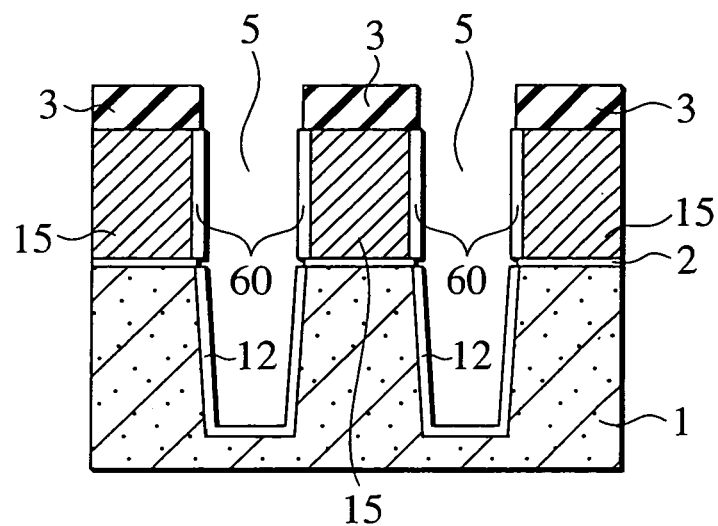

As shown in FIG. 12C, in order to prevent damage to the substrate 1 during deposition of an HDP film 7, the inside of this trench 5 is oxidized in advance to a film thickness of about 10 nm before filling the HDP film 7. This oxidation is carried out according to an oxygen or steam thermal oxidation technique. This oxidation may be carried out by ozone (O3) oxidation. In accordance with this oxidation, silicon oxide films 12 and 60 are formed on the internal surface in the trench 5 of the exposed silicon substrate 1 and on the side face of the gate 15.

Figure 12D:
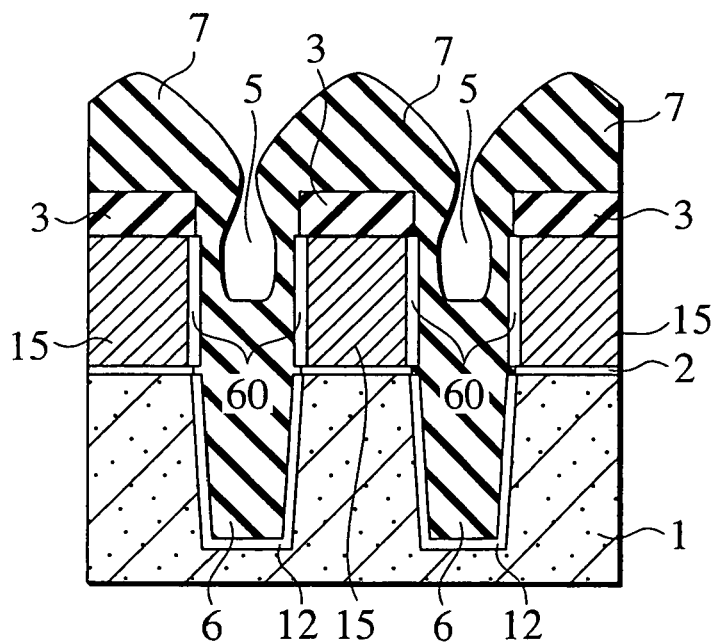

As shown in FIG. 12D, HDP films 6 and 7 are deposited. On the internal face of the trench 5 formed on the surface or upward of the semiconductor substrate 1, the deposition of the silicon oxide films 6 and 7 using the HDP technique is begun. Then, before the silicon oxide films 6 and 7 closes the opening of the trench 5, the deposition of the silicon oxide films 6 and 7 is stopped. The height of the lowest site on the upper face of the silicon oxide film 6 is higher than that of the upper face of the silicon oxide film 2.

Figure 12E:
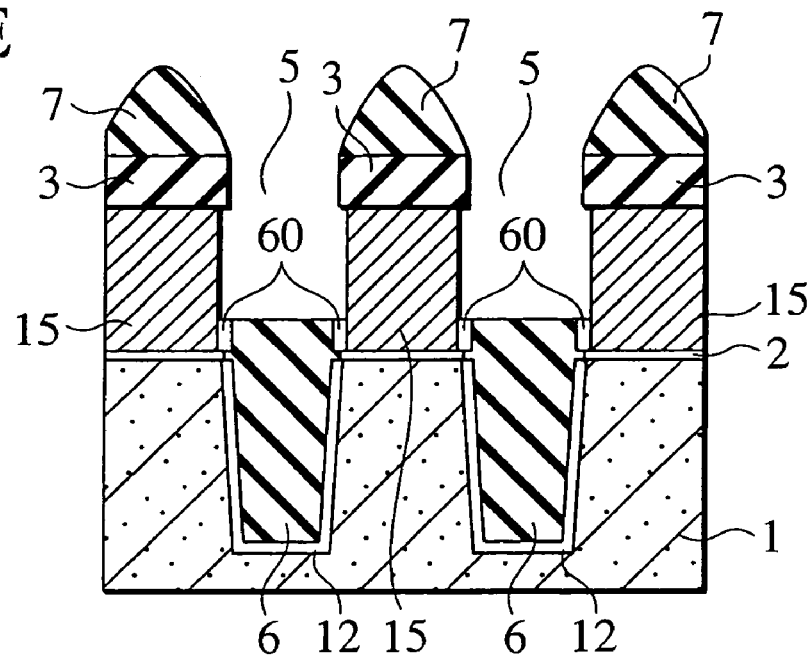

As shown in FIG. 12E, the HDP film 7 deposited on the side face of the trench 5 is removed by etching. The upper part of the oxide film 60 located at the upper part in the trench 5 is also removed at the same time. After etching, the height at the lowest site of the upper face of the silicon oxide film 6 is still higher than that of the upper face of the silicon oxide film 2. In this manner, the silicon oxide film 2 is not etched.

Figure 12F:
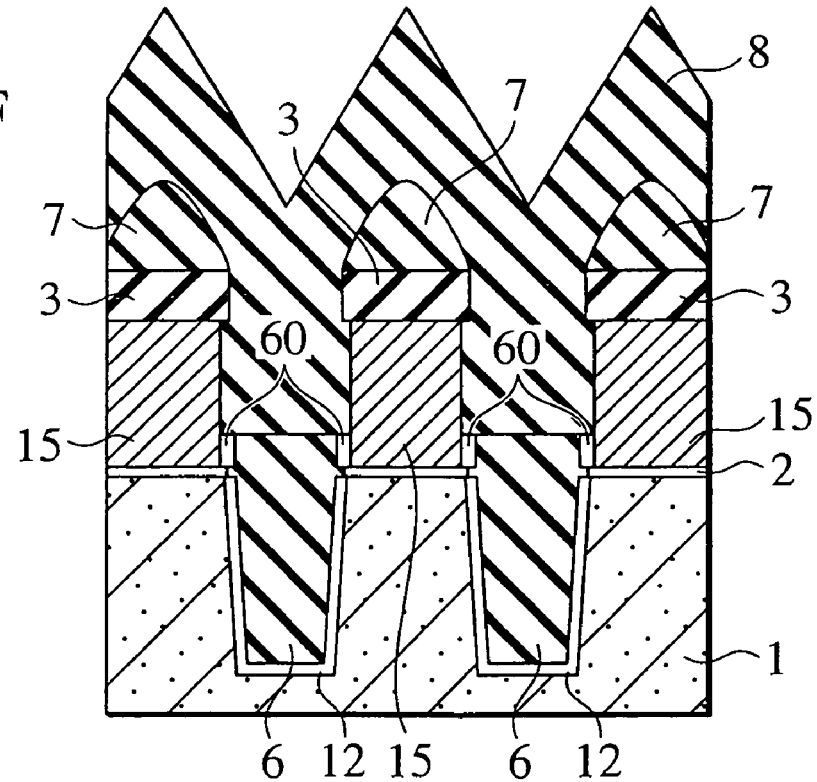

As shown in FIG. 12F, the second deposition of the HDP film 8 is carried out. The aspect ratio of the trench 5 is small, thus making it possible to fill the trench 5 without any void.

Figure 12G:
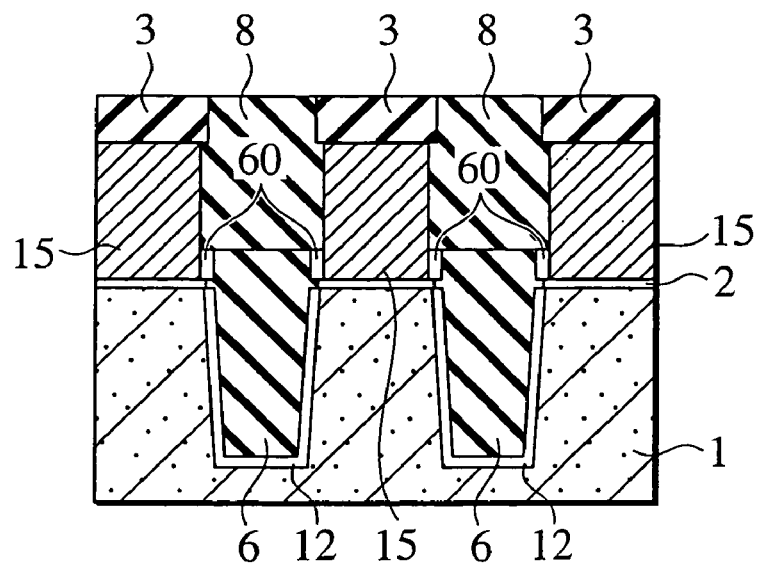

As shown in FIG. 12G, the silicon oxide films 8 and 7 are polished according to the CMP technique down to the height of the upper face of the mask 3. The mask 3 serves as a stopper according to the CMP technique.

Figure 12H:
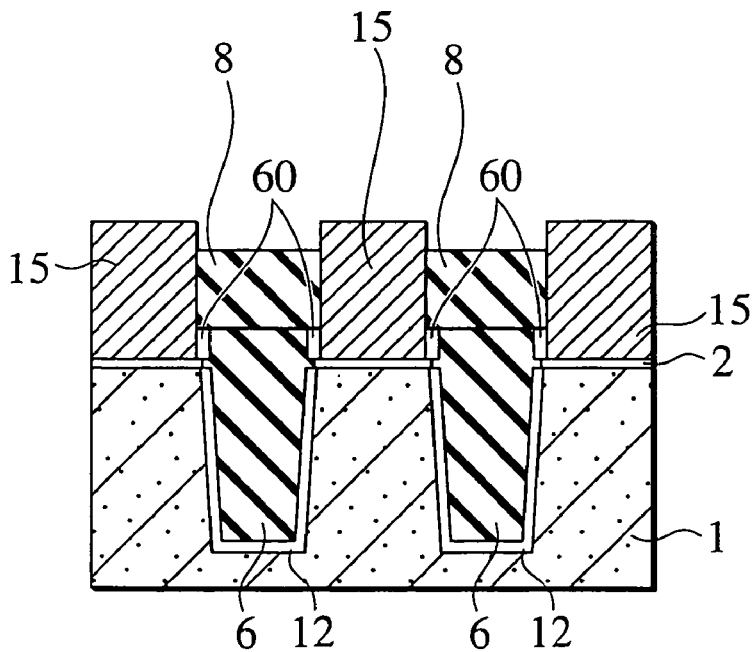

As shown in FIG. 12H, the surface of the HDP film 8 is lowered by wet etching of a diluted hydrofluoric acid the mask 3 is removed. In the foregoing, the STI areas 6 and 12 can be formed.

In addition, the semiconductor device according to the eleventh embodiment, as shown in FIG. 12H, is composed of: a semiconductor substrate 1, a silicon oxide film 2, a polysilicon film 15, a silicon oxide film 12, a bottom insulator 6, a silicon oxide film 60, and an upper insulator 8. The semiconductor substrate 1 has the trench 5 on the surface. The insulating film 2 is provided so that the back face comes into contact with the surface top of the substrate 1, and has an opening on the trench 5. The polysilicon film 15 is provided on the surface of the insulating film 2, and has an opening on the trench 5. The silicon oxide film 12 comes into contact with the bottom face and side face of the trench 5, comes into contact with the side face of the opening of the film 2, and is uniform in film thickness. The bottom insulator 6, at the bottom face and side face, comes into contact with the surface of the silicon oxide film 12.

The silicon oxide film 60, at the back face, comes into contact with the polysilicon film 15, and the oxide film 60, at the surface, comes into contact with the bottom insulator 6. At one end, the silicon oxide film 60 comes into contact with the silicon oxide film 2. The height of the end face at the other end of the silicon oxide film 60 is equal to that of the upper face of the bottom insulator 6. The bottom face of the upper insulator 8 comes into with the other end of the silicon oxide film 60 and the upper face of the bottom insulator 6. The side face of the upper insulator 8 comes into that of the polysilicon film 15. The silicon oxide film 61 is provided on the polysilicon film 15 and the upper insulator 8. It is preferable that the trench 5 of the semiconductor substrate 1 is equal to or smaller than 3 in aspect ratio. In this manner, when the HDP film 7 deposited on the side face of the trench 5 is removed by etching, the silicon oxide film 2 serving as the gate oxide layer is not etched.

As has been described above, there can be provided a semiconductor device having a trench which has a high aspect ratio, the semiconductor device being filled according to a HDP technique.

In addition, there can be provided a method for manufacturing a semiconductor device capable of filling according to the HDP technique a trench having a high aspect ratio, the trench being formed in a process of manufacturing a semiconductor device.

The HDP film is advantageous in that the film has the hydrofluoric acid etching rate identical to the thermal oxide film even without applying heat treatment after deposition, and in that the film can fill a trench with a to some extent high aspect. It is possible to fill with the HDP film a trench with a high aspect ratio which cannot be filled with an earlier HDP film. Thus, STI area having the high aspect ratio caused by further miniaturization of a semiconductor device can be manufactured with the HDP film.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A manufacturing method of a semiconductor device, comprising:
    forming a trench on an upper surface of a semiconductor substrate;
    oxidizing thermally an internal surface of the trench;
    forming a first silicon oxide film into the trench with a high density plasma;
    removing the first silicon oxide film formed on a side face of the internal surface until a part of the side face is exposed;
    oxidizing thermally the part of the side face exposed; and
    forming a second silicon oxide film on the first silicon oxide film and on the side face with a high density plasma.

2. The manufacturing method of the semiconductor device of claim 1, wherein said removing includes isotropic wet etching.

3. A manufacturing method of a semiconductor device, comprising:
    forming a trench on an upper surface of a semiconductor substrate;
    forming a first silicon oxide film into the trench with a high density plasma;
    removing the first silicon oxide film formed on the upper surface until the upper surface and an opening of the trench are exposed, so that the first silicon oxide film remains on a side face of the trench; and
    forming a second silicon oxide film on the first silicon oxide film and on the exposed upper surface with a high density plasma.

4. The manufacturing method of the semiconductor device of claim 3, wherein said removing includes chemical mechanical polishing.

5. A manufacturing method of a semiconductor device, comprising:
    forming an insulating film on a semiconductor substrate,
    forming a polysilicon film on the insulating film;
    forming a trench penetrating the insulating film and the polysilicon film and dug in the semiconductor substrate;
    forming a thermal oxide film on an internal surface of the trench by a oxidation of an oxygen radical; and
    filling a first silicon oxide film into the trench with a high density plasma.

6. The manufacturing method of the semiconductor device of claim 5, further comprising:
    removing the first silicon oxide film formed on a side face of the internal surface until a part of the side face is exposed; and
    forming a second silicon oxide film on the first silicon oxide film and on the side face with a high density plasma.

7. A manufacturing method of a semiconductor device, comprising:
    forming an insulating film on a semiconductor substrate;

forming a polysilicon film on the insulating film;

forming a trench penetrating the insulating film and the polysilicon film and dug in the semiconductor substrate;

forming a first thermal oxide film and a second thermal oxide film by a thermal oxidation of the semiconductor substrate and the polysilicon film on an internal surface of the trench, forming a first silicon oxide film on the first thermal oxide film and the second thermal oxide film with a high density plasma;

removing the first silicon oxide film formed on an upper part of the second thermal oxide film; and forming a second silicon oxide film on the first silicon oxide film with a high density plasma.

8. The manufacturing method of the semiconductor device of claim 7, wherein in said forming the first silicon oxide film, a height of a lowest surface of the first silicon oxide film in the trench is higher than a height of a surface of the insulating film.

* * * * *